(12) United States Patent
Yamazaki et al.

(10) Patent No.: US 11,785,826 B2
(45) Date of Patent: Oct. 10, 2023

(54) TOUCH PANEL

(71) Applicant: Semiconductor Energy Laboratory Co., Ltd., Atsugi (JP)

(72) Inventors: Shunpei Yamazaki, Setagaya (JP); Yoshiharu Hirakata, Ebina (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/521,925

(22) Filed: Nov. 9, 2021

(65) Prior Publication Data

US 2022/0069020 A1    Mar. 3, 2022

Related U.S. Application Data

(63) Continuation of application No. 15/819,017, filed on Nov. 21, 2017, now Pat. No. 11,177,328, which is a
(Continued)

(30) Foreign Application Priority Data

Nov. 27, 2013  (JP) ................................. 2013-245397
Nov. 27, 2013  (JP) ................................. 2013-245400

(51) Int. Cl.
*G06F 3/041*  (2006.01)
*G06F 3/044*  (2006.01)
(Continued)

(52) U.S. Cl.
CPC ........... *H10K 59/40* (2023.02); *G06F 1/1652* (2013.01); *G06F 3/0412* (2013.01);
(Continued)

(58) Field of Classification Search
None
See application file for complete search history.

(56) References Cited

U.S. PATENT DOCUMENTS 6,849,877 B2    2/2005   Yamazaki et al.
7,211,828 B2    5/2007   Yamazaki et al.
(Continued)

FOREIGN PATENT DOCUMENTS

CN    102456849 A    5/2012
EP    2144146 A      1/2010
(Continued)

OTHER PUBLICATIONS

Taiwanese Office Action (Application No. 110103766) dated Feb. 16, 2022.

*Primary Examiner* — Xiaoming Liu
(74) *Attorney, Agent, or Firm* — ROBINSON INTELLECTUAL PROPERTY LAW OFFICE; Eric J. Robinson

(57) ABSTRACT

A flexible touch panel is provided. Both reduction in thickness and high sensitivity of a touch panel are achieved. The touch panel includes a first flexible substrate, a first insulating layer over the first substrate, a transistor and a light-emitting element over the first insulating layer, a color filter over the light-emitting element, a pair of sensor electrodes over the color filter, a second insulating layer over the sensor electrodes, a second flexible substrate over the second insulating layer, and a protective layer over the second substrate. A first bonding layer is between the light-emitting element and the color filter. The thickness of the first substrate and the second substrate is each 1 μm to 200 μm inclusive. The first bonding layer includes a region with a thickness of 50 nm to 10 μm inclusive.

10 Claims, 23 Drawing Sheets

Related U.S. Application Data continuation of application No. 14/551,955, filed on Nov. 24, 2014, now Pat. No. 9,847,380.

(51) Int. Cl.
  *H10K 59/40* (2023.01)
  *G06F 1/16* (2006.01)
  *H10K 10/88* (2023.01)
  *H10K 59/38* (2023.01)
  *H10K 77/10* (2023.01)

(52) U.S. Cl.
  CPC .......... *G06F 3/0445* (2019.05); *G06F 3/0446* (2019.05); *G06F 3/0447* (2019.05); *G06F 3/04164* (2019.05); *G06F 3/04184* (2019.05); *G06F 2203/04102* (2013.01); *G06F 2203/04103* (2013.01); *H10K 10/88* (2023.02); *H10K 59/38* (2023.02); *H10K 77/111* (2023.02)

(56) References Cited

U.S. PATENT DOCUMENTS

| | | | |
|---|---|---|---|
| 7,245,331 | B2 | 7/2007 | Yamazaki et al. |
| 7,420,208 | B2 | 9/2008 | Yamazaki et al. |
| 7,714,950 | B2 | 5/2010 | Yamazaki et al. |
| 7,728,326 | B2 | 6/2010 | Yamazaki et al. |
| 7,952,101 | B2 | 5/2011 | Yamazaki et al. |
| 8,134,149 | B2 | 3/2012 | Yamazaki et al. |
| 8,228,454 | B2 | 7/2012 | Yamazaki et al. |
| 8,415,208 | B2 | 4/2013 | Takayama et al. |
| 8,415,660 | B2 | 4/2013 | Yamazaki et al. |
| 8,508,682 | B2 | 8/2013 | Yamazaki et al. |
| 8,629,842 | B2 | 1/2014 | Jang |
| 8,730,186 | B2 | 5/2014 | Tamura et al. |
| 8,822,982 | B2 | 9/2014 | Yamazaki et al. |
| 8,830,413 | B2 | 9/2014 | Yamazaki et al. |
| 8,928,597 | B2 | 1/2015 | Jang |
| 8,933,451 | B2 | 1/2015 | Kim et al. |
| 8,970,520 | B2 | 3/2015 | Teraguchi et al. |
| 9,013,650 | B2 | 4/2015 | Yamazaki et al. |
| 9,082,678 | B2 | 7/2015 | Yamazaki et al. |
| 9,166,180 | B2 | 10/2015 | Yamazaki et al. |
| 9,178,168 | B2 | 11/2015 | Yamazaki et al. |
| 9,207,798 | B2 | 12/2015 | Tamura et al. |
| 9,218,081 | B2 | 12/2015 | Yamazaki et al. |
| 9,276,224 | B2 | 3/2016 | Yamazaki et al. |
| 9,299,879 | B2 | 3/2016 | Yamazaki et al. |
| 9,337,244 | B2 | 5/2016 | Hatano et al. |
| 9,342,176 | B2 | 5/2016 | Kim et al. |
| 9,772,709 | B2 | 9/2017 | Kim et al. |
| 9,893,126 | B2 | 2/2018 | Jang |
| 9,915,979 | B2 | 3/2018 | Miyazaki et al. |
| 10,013,087 | B2 | 7/2018 | Yamazaki et al. |
| 10,936,132 | B2 | 3/2021 | Jang |
| 2003/0034497 | A1 | 2/2003 | Yamazaki et al. |
| 2009/0109202 | A1 | 4/2009 | Kitagawa |
| 2010/0008068 | A1 | 1/2010 | Kim et al. |
| 2010/0013745 | A1 | 1/2010 | Kim et al. |
| 2010/0066240 | A1 | 3/2010 | Park et al. |
| 2010/0108409 | A1 | 5/2010 | Tanaka et al. |
| 2010/0300862 | A1 | 12/2010 | Tamura et al. |
| 2011/0216043 | A1 | 9/2011 | Tamura et al. |
| 2011/0267297 | A1 | 11/2011 | Yamazaki et al. |
| 2012/0001874 | A1 | 1/2012 | Kurokawa et al. |
| 2012/0037916 | A1 | 2/2012 | Song et al. |
| 2012/0217516 | A1* | 8/2012 | Hatano ................ H01L 51/525 257/E33.062 |
| 2012/0249454 | A1 | 10/2012 | Teraguchi et al. |
| 2013/0075739 | A1 | 3/2013 | Loy et al. |
| 2013/0082970 | A1 | 4/2013 | Frey et al. |
| 2013/0147730 | A1 | 6/2013 | Chien et al. |
| 2013/0194671 | A1 | 8/2013 | Dai et al. |
| 2013/0200364 | A1 | 8/2013 | Tokunaga et al. |
| 2014/0008668 | A1 | 1/2014 | Hirakata |
| 2014/0014960 | A1 | 1/2014 | Yamazaki et al. |
| 2014/0063364 | A1 | 3/2014 | Hirakata |
| 2014/0063719 | A1 | 3/2014 | Yamazaki et al. |
| 2014/0085277 | A1 | 3/2014 | Iwaki |
| 2014/0104508 | A1 | 4/2014 | Yamazaki et al. |
| 2014/0306260 | A1 | 10/2014 | Yamazaki et al. |
| 2014/0326974 | A1 | 11/2014 | Yamazaki et al. |
| 2014/0361980 | A1 | 12/2014 | Iwaki et al. |
| 2014/0375660 | A1 | 12/2014 | Tamaki |
| 2015/0009128 | A1 | 1/2015 | Matsumoto |
| 2015/0060817 | A1 | 3/2015 | Sato et al. |
| 2015/0062525 | A1 | 3/2015 | Hirakata |
| 2015/0069362 | A1* | 3/2015 | Ito ..................... G06F 3/0446 257/40 |
| 2015/0138072 | A1 | 5/2015 | Yamazaki et al. |
| 2015/0153861 | A1 | 6/2015 | Yamazaki et al. |
| 2015/0153862 | A1 | 6/2015 | Nakamura. et al. |
| 2015/0154730 | A1 | 6/2015 | Hirakata et al. |
| 2015/0177789 | A1 | 6/2015 | Jinbo |
| 2018/0307358 | A1 | 10/2018 | Yamazaki et al. |

FOREIGN PATENT DOCUMENTS

| | | |
|---|---|---|
| EP | 2148264 A | 1/2010 |
| EP | 2187294 A | 5/2010 |
| EP | 2575018 A | 4/2013 |
| JP | 2002-350869 A | 12/2002 |
| JP | 2003-086356 A | 3/2003 |
| JP | 2003-174153 A | 6/2003 |
| JP | 2003-271075 A | 9/2003 |
| JP | 2008-191850 A | 8/2008 |
| JP | 2009-199979 A | 9/2009 |
| JP | 2010-028115 A | 2/2010 |
| JP | 2011-008775 A | 1/2011 |
| JP | 2011-070092 A | 4/2011 |
| JP | 2011-227923 A | 11/2011 |
| JP | 2011-253676 A | 12/2011 |
| JP | 2012-088683 A | 5/2012 |
| JP | 2012-190794 A | 10/2012 |
| JP | 2012-212076 A | 11/2012 |
| JP | 2013-084989 A | 5/2013 |
| KR | 2010-0119620 A | 11/2010 |
| KR | 2013-0059350 A | 6/2013 |
| TW | 201030586 | 8/2010 |
| WO | WO-2004/064018 | 7/2004 |
| WO | WO-2011/135988 | 11/2011 |
| WO | WO-2012/115016 | 8/2012 |
| WO | WO-2013/042533 | 3/2013 |
| WO | WO-2013/141292 | 9/2013 |

* cited by examiner

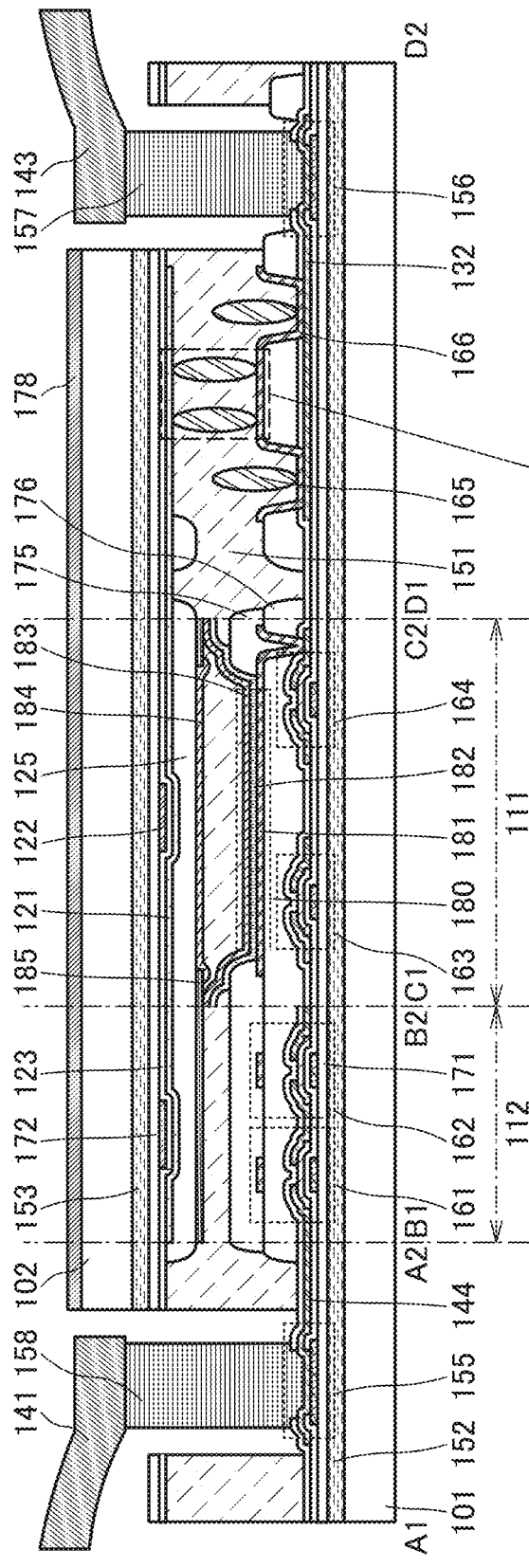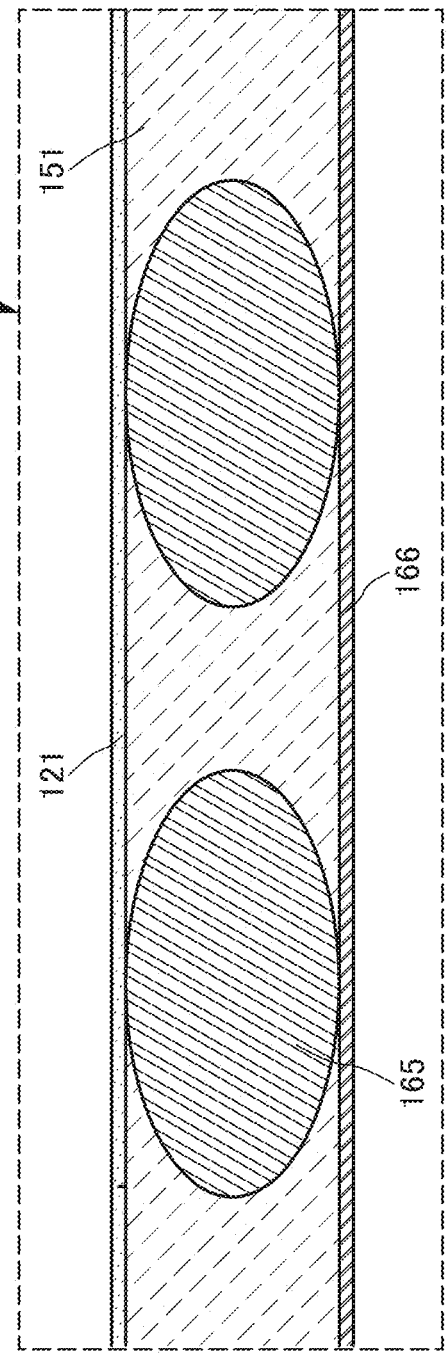

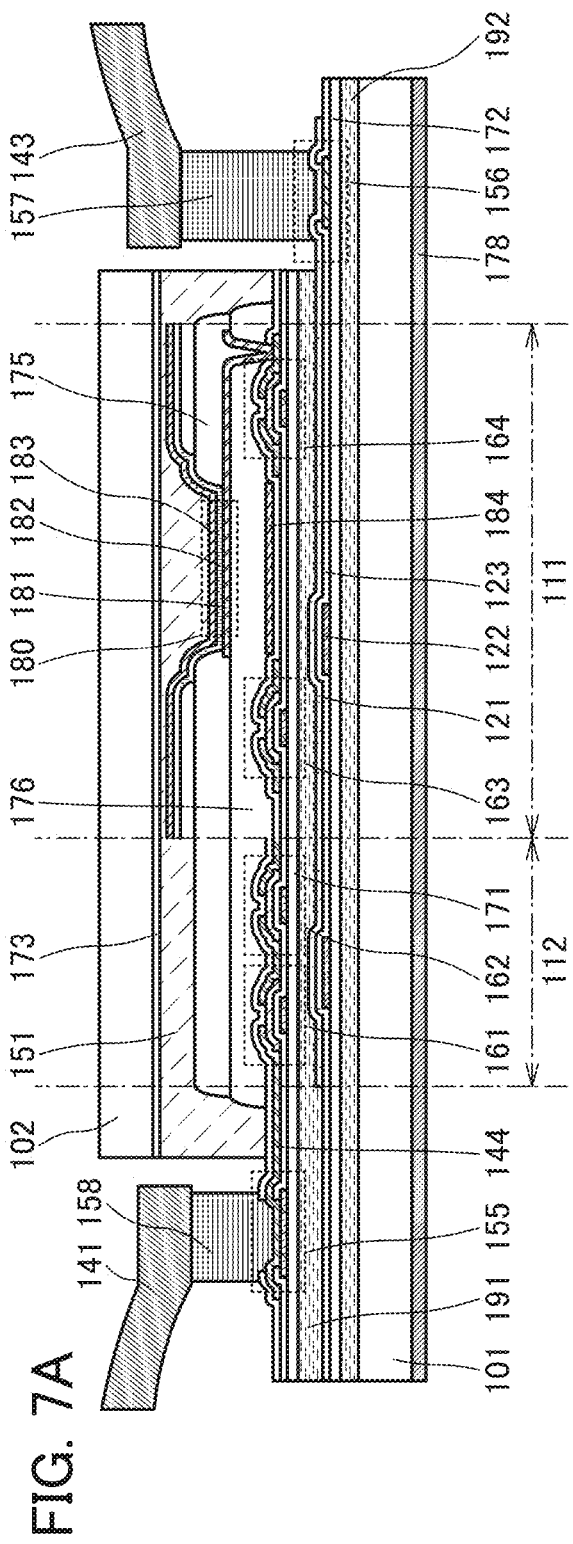
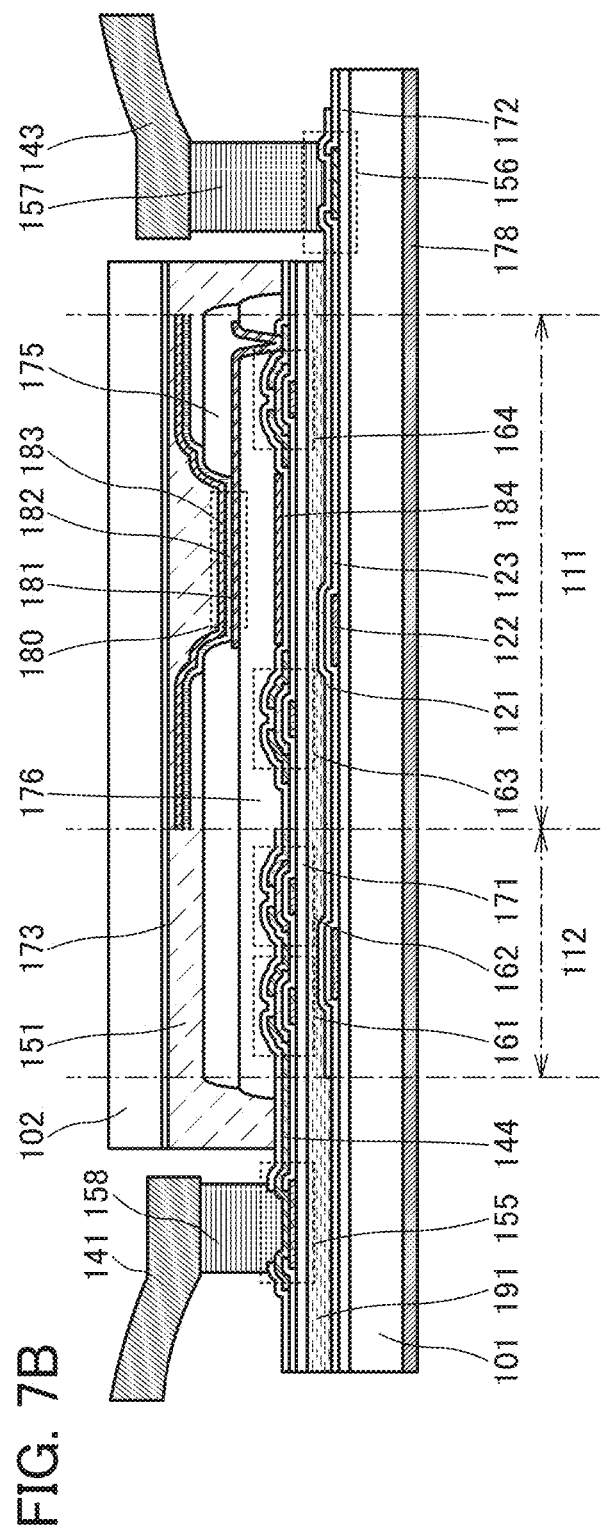

TOUCH PANEL

BACKGROUND OF THE INVENTION

1. Field of the Invention

One embodiment of the present invention relates to a display device, particularly a display device which is flexible and curved. One embodiment of the present invention relates to a touch panel, particularly a touch panel which is flexible and curved.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a storage device, a method for driving any of them, and a method for manufacturing any of them.

2. Description of the Related Art

Recent display devices are expected to be applied to a variety of uses and become diversified. For example, reduction in thickness, improvement in performance, and multi-functionalization of a portable information terminal such as a smartphone or a tablet terminal including a touch panel have progressed.

Patent Document 1 discloses a flexible active matrix light-emitting device in which an organic EL element and a transistor serving as a switching element are provided over a film substrate.

REFERENCE

Patent Document

Patent Document 1: Japanese Published Patent Application No. 2003-174153

SUMMARY OF THE INVENTION

What is desirable is a touch panel in which a display device thinned to have flexibility is provided with a function of inputting data with a finger or the like touching a screen as a user interface.

An object of one embodiment of the present invention is to provide a flexible touch panel. Another object of one embodiment of the present invention is to achieve both reduction in thickness and high sensitivity of a touch panel. Another object is to provide a novel display device, touch sensor, or touch panel.

Note that the descriptions of these objects do not disturb the existence of other objects, and there is no need to achieve all the objects. Objects other than the above objects will be apparent from and can be derived from the description of the specification and the like.

One embodiment of the present invention is a touch panel including a first flexible substrate, a first insulating layer over the first substrate, a transistor and a light-emitting element over the first insulating layer, a color filter over the light-emitting element, a pair of sensor electrodes over the color filter, a second insulating layer over the sensor electrodes, a second flexible substrate over the second insulating layer, and a protective layer over the second substrate. A first bonding layer is included between the light-emitting element and the color filter. The thickness of the first substrate and the second substrate is each greater than or equal to 1 µm and less than or equal to 200 µm. The first bonding layer includes a region with a thickness of greater than or equal to 50 nm and less than or equal to 10 µm.

It is preferable that a first conductive film be provided over the first insulating layer and that one of the sensor electrodes be electrically connected to the first conductive film by a conductive connector.

Another embodiment of the present invention is a touch panel including a first flexible substrate, a pair of sensor electrodes over the first substrate, a first insulating layer over the sensor electrodes, a transistor and a light-emitting element over the first insulating layer, a color filter below the light-emitting element, a second insulating layer over the color filter and the light-emitting element, a second flexible substrate over the second insulating layer, and a protective layer below the first substrate. A first adhesive layer is included between the light-emitting element and the second insulating layer. The thickness of the first substrate and the second substrate is each greater than or equal to 1 µm and less than or equal to 200 µm. The first adhesive layer includes a region with a thickness of greater than or equal to 50 nm and less than or equal to 10 µm.

It is preferable to use an oxide semiconductor for a semiconductor layer in which a channel of the transistor is formed.

Polycrystalline silicon may be used for the semiconductor layer in which a channel of the transistor is formed.

It is preferable that the protective layer contain aluminum oxide or yttrium oxide.

It is preferable that a second adhesive layer be provided between the first insulating layer and the first substrate and the thickness of the second adhesive layer be greater than or equal to 50 nm and less than or equal to 10 µm.

It is preferable that a third adhesive layer be provided between the second insulating layer and the second substrate and the thickness of the third adhesive layer be greater than or equal to 50 nm and less than or equal to 10 µm.

According to one embodiment of the present invention, a flexible touch panel is provided or both reduction in thickness and high sensitivity of a touch panel are achieved.

A novel display device, touch sensor, or touch panel can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 2A and 2B illustrate an example of a structure of a touch panel.

FIGS. 7A and 7B illustrate an example of a structure of a touch panel.

DETAILED DESCRIPTION OF THE INVENTION

Figure 1A:
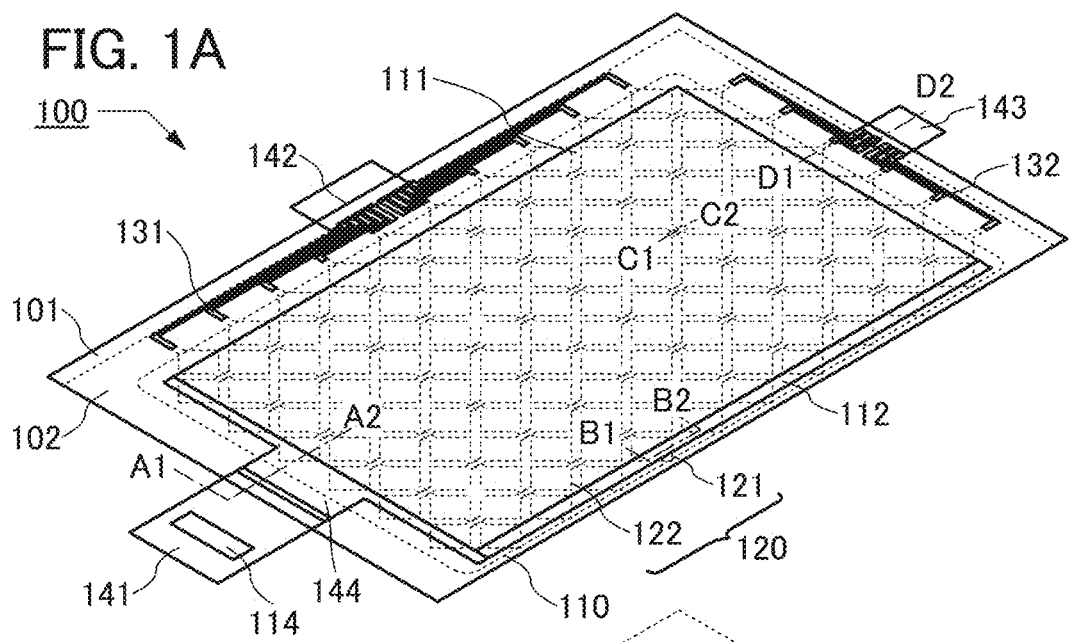
FIGS. 1A to 1C illustrate an example of a structure of a touch panel.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes below.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In this embodiment, a structure of a touch panel of one embodiment of the present invention will be described with reference to drawings.

[Structure Example of Touch Panel]

FIG. 1A is a schematic perspective diagram of a touch panel 100 described in this embodiment.

The touch panel 100 includes at least a display device 110 and a touch sensor 120 between a flexible substrate 101 and a flexible substrate 102.

Figure 1B:
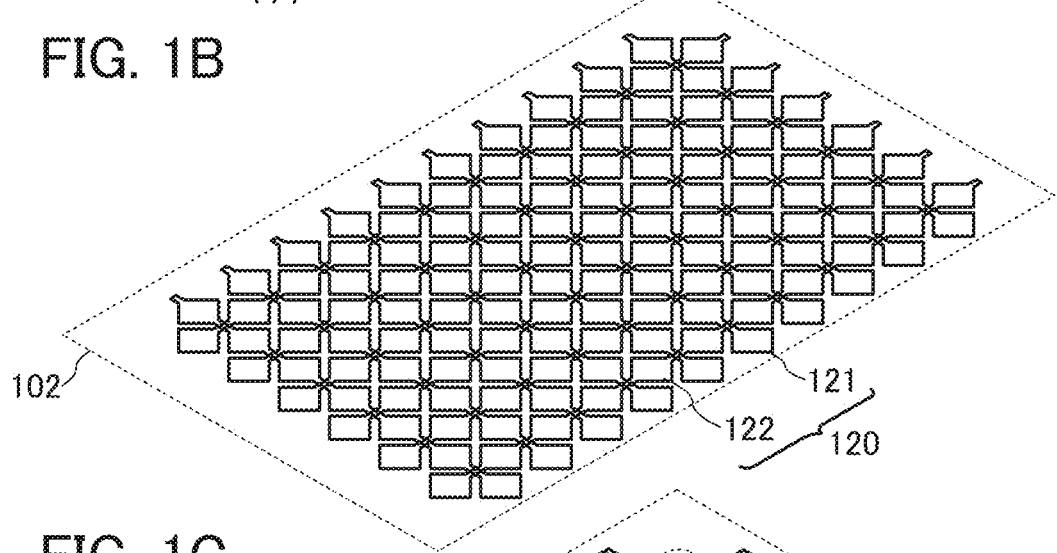
Figure 1C:
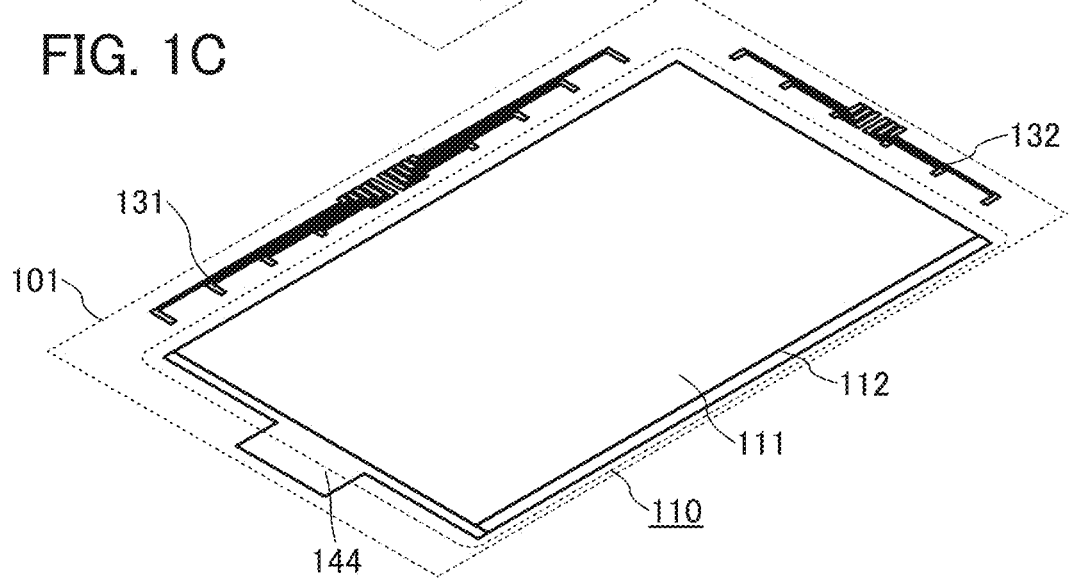

FIG. 1B is a schematic perspective diagram of the touch sensor 120 in FIG. 1A. FIG. 1C is a schematic perspective diagram showing a structure including the display device 110, a wiring 131, a wiring 132, and a wiring 144 in FIG. 1A.

As the touch sensor 120, a capacitive touch sensor can be used. Examples of the capacitive touch sensor are a surface capacitive touch sensor and a projected capacitive touch sensor. Examples of the projected capacitive touch sensor are a self-capacitive touch sensor and a mutual capacitive touch sensor, which differ mainly in the driving method. The use of a mutual capacitive type is preferable because multiple points can be sensed simultaneously.

An example of using a projected capacitive touch sensor is described below.

Note that a variety of sensors (e.g., an optical sensor using a photoelectric conversion element, a pressure-sensitive sensor using a pressure-sensitive element) that can sense the approach or the contact of a sensing target such as a finger, can be used.

The touch sensor 120 includes a plurality of electrodes 121 and a plurality of electrodes 122. The electrode 121 is electrically connected to any of the plurality of wirings 131, and the electrode 122 is electrically connected to any of the plurality of wirings 132. An FPC 142 and an FPC 143 are electrically connected to the wirings 131 and the wirings 132, respectively.

The electrode 121 extends in one direction. The electrode 122 extends in a direction intersecting with the electrode 121. A dielectric layer is provided between the electrodes 121 and 122. A capacitance is generated at their intersection. The touch sensor 120 thus includes the plurality of electrodes 121, the plurality of electrodes 122, and the dielectric layers between the electrodes, in which a plurality of capacitors is arranged in matrix.

The electrodes 121 and 122 preferably have light-transmitting properties and have as little space between them as possible as shown in FIG. 1B. A dummy electrode including the same conductive film as the electrode 121 or 122 may be provided between the electrodes 121 and 122. Such a structure with space between the electrodes 121 and 122 as little as possible can reduce variation in transmittance. As a result, unevenness in emission luminance of the touch sensor 120 can be reduced.

The display device 110 at least includes a display portion 111 including a plurality of pixels and a wiring 144 for supplying signals and electric power to the display portion 111. Each pixel included in the display portion 111 preferably includes a transistor and a display element. As the display element, an organic EL element can be used.

The display device 110 in FIGS. 1A to 1C includes not only the display portion 111 but also a driver circuit 112. A circuit functioning as a scan line driver circuit, a signal line driver circuit, or the like can be used as the driver circuit 112.

The FPC 141 is electrically connected to the wiring 144. A signal or electric power for operating the display device 110 can be supplied from the FPC 141 via the wiring 144.

In FIGS. 1A to 1C, an IC 114 is provided over the FPC 141 by a COF method. A circuit functioning as a scan line driver circuit, a signal line driver circuit, or the like can be used for the IC 114. Note that the IC 114 may be omitted when such a circuit functioning as a scan line driver circuit, a signal line driver circuit, or the like is included in the display device 110, or when a signal for operating the display device 110 is supplied via the FPC 141 and a circuit functioning as a scan line driver circuit, a signal line driver circuit, or the like is provided outside.

In FIGS. 1A to 1C, the display device 110 and the wirings 131 and 132 are provided on the first substrate 101 side, whereas the touch sensor 120 is provided on the second substrate 102 side.

[Cross-Sectional Structure Example]

FIG. 2A shows a cross-sectional structure example of one pixel of the display portion 111 along cut lines A1-A2, B1-B2, C1-C2, and D1-D2 in FIG. 1A.

The first substrate 101 and the second substrate 102 are bonded to each other with a first adhesive layer 151. In addition, the first adhesive layer 151 may be provided between a light-emitting element 180 and a color filter 184.

The thickness of each of the flexible first and second substrates 101 and 102 is, for example, greater than or equal to 1 μm and less than or equal to 200 μm, preferably greater than or equal to 3 μm and less than or equal to 100 μm, more preferably greater than or equal to 5 μm and less than or equal to 50 μm, and typically approximately 20 μm. When the thickness is less than 1 μm, the touch panel 100 might be damaged because of insufficient mechanical strength. In contrast, when the thickness is greater than 200 μm, the substrate itself and the wirings and elements formed over the substrate might be broken because of poor flexibility and increased bending stress generated by bending the touch panel.

The thicknesses of the first substrate 101 and the second substrate 102 are preferably equal or substantially equal to each other. By making the first substrate 101 and the second substrate 102 the same thickness, the display device 110 and the touch sensor 120 mounted to them can be positioned at the center of the touch panel. This suppresses the influence of bending stress generated by bending the touch panel on the display device 110 and the touch sensor 120, and defects such as breakage by bending are suppressed to achieve the highly reliable touch panel 100. For example, the smaller thickness between the first substrate 101 and the second substrate 102 is more than or equal to 80% the larger thickness, preferably more than or equal to 90%, further preferably more than or equal to 95%.

Linear thermal expansion coefficients of materials of the first substrate 101 and the second substrate 102 are preferably the same or substantially the same. By making their linear thermal expansion coefficients the same value, unintentional curve of the touch panel 100 can be prevented when heat temperature in manufacturing process or temperature in use is changed. Also, temperature range for guaranteed stable operating of the touch panel can be widened. A difference between the linear thermal expansion coefficient of the material of the first substrate 101 and that of the material of the second substrate 102 in the range from 0° C. to 200° C. is 10 ppm/K or less, preferably 5 ppm/K or less, more preferably 2 ppm/K or less.

FIG. 2A shows transistors 161 and 162 included in the driver circuit 112 and transistors 163 and 164 included in the pixel of the display portion 111. The transistors are provided over a first insulating layer 171.

FIGS. 1A to 1C and FIG. 2A show a driver-integrated display device in which the driver circuit 112 is formed over the first insulating layer 171 where the display portion 111 is formed. Alternatively, one or both of a circuit functioning as a scan line driver circuit and a circuit functioning as a signal line driver circuit may be provided on a surface different from the insulating surface where the display portion 111 is formed. For example, a driver circuit IC may be mounted by a COG method, or a flexible printed circuits (FPC) mounted with a driver circuit IC by a COF method may be mounted.

FIG. 2A shows bottom-gate transistors as an example of transistors included in the driver circuit 112 and the display portion 111.

Here, transistors used in the pixels included in the display portion 111, the driver circuit 112, and the like of the display device 110 preferably include an oxide semiconductor for a semiconductor layer where a channel is formed. In particular, an oxide semiconductor with wider bandgap than silicon is preferable. A semiconductor material having a wider bandgap and a lower carrier density than silicon is preferably used because off-state leakage current of the transistor can be reduced.

For example, the semiconductor layer preferably contains at least indium (In) or zinc (Zn) as the oxide semiconductor, more preferably an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor, and generation of a crack in an oxide semiconductor film which is caused by stress when a display panel is bent is thus prevented. Therefore, such an oxide semiconductor can be preferably used for a flexible display panel which is used in a bent state, or the like.

The use of such materials for the semiconductor layer makes it possible to provide a highly reliable transistor in which a change in the electrical characteristics is suppressed.

In addition, because a transistor using an oxide semiconductor for a semiconductor layer has small source-drain leakage current in an off-state (off-state current), charge accumulated in a capacitor through a transistor can be held for a long time. When such a transistor is used for a pixel, operation of a driver circuit can be stopped while a gray scale of an image displayed on each display region is maintained. As a result, an electronic device with an extremely low power consumption can be obtained.

Note that details of a preferable mode and a formation method of an oxide semiconductor that can be used for the semiconductor layer are described later.

The touch sensor 120 is preferably operated w % bile pixels stop operating. With such an operation, the influence of noise caused when pixels are operated can be removed and the sensitivity of the touch sensor 120 can be increased. By removing the influence of noise, the distance between the touch sensor and the display portion 111 or the driver circuit 112 can be largely decreased. Specifically, in a region where the light-emitting element 180 overlaps the color filter 184, the thickness of the adhesive layer 151 can be 50 nm to 10 μm inclusive, preferably 50 nm to 5 μm inclusive, further preferably 100 nm to 3 μm inclusive, and the distance between the first substrate 101 and the second substrate 102 can be thus reduced.

Note that an example of a method for driving the touch sensor 120 and the display device 110 will be described below.

Silicon may be used for a semiconductor layer where a channel of a transistor used for a pixel included in a display region or a driver circuit in the display device 110 are formed. Although amorphous silicon may be used as silicon, silicon having crystallinity is particularly preferable. For example, microcrystalline silicon, polycrystalline silicon, single crystal silicon, or the like is preferably used. Polycrystalline silicon can be formed at a lower temperature than single crystal silicon and has higher field effect mobility and higher reliability than amorphous silicon. Using such a polycrystalline semiconductor for a pixel can improve the aperture ratio of the pixel. Even in the case where pixels are provided at extremely high resolution, a gate driver circuit and a source driver circuit can be formed over a substrate over which the pixels are formed, and the number of components of an electronic device can be reduced.

The transistors 161 and 162 may each have a second gate as shown in FIG. 2A. For example, the second gate of the transistor 161 may be electrically connected to the gate of the transistor 161, or these gates may be supplied with different potentials. If necessary, the transistors 163 and 164 may also be provided with a second gate. If unnecessary, the second gates of the transistors 161 and 162 can be removed.

As a gate, source, and drain of a transistor, and a wiring or an electrode included in a touch panel, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. Other examples are a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, a three-layer structure in which a tungsten film, a copper film, and a tungsten film are stacked in this order, and the like. Note that a transparent conductive material containing indium oxide, tin oxide, or zinc oxide may be used. Using copper containing manganese is preferable because shape controllability by etching is increased.

One pixel in the display portion 111 includes the switching transistor 163, the current control transistor 164, and a first electrode 181 is provided over the insulating layer 176. The first electrode 181 is electrically connected to one electrode (a source electrode or a drain electrode) of the transistor 164. An insulating layer 175 is provided to cover an end portion of the first electrode 181.

Note that the structures of the transistors included in the display portion 111, the driver circuit 112, and the like are not limited to the above. For example, a forward staggered transistor or an inverted staggered transistor may be used. A top-gate transistor or a bottom-gate transistor may be used.

Figure 3:
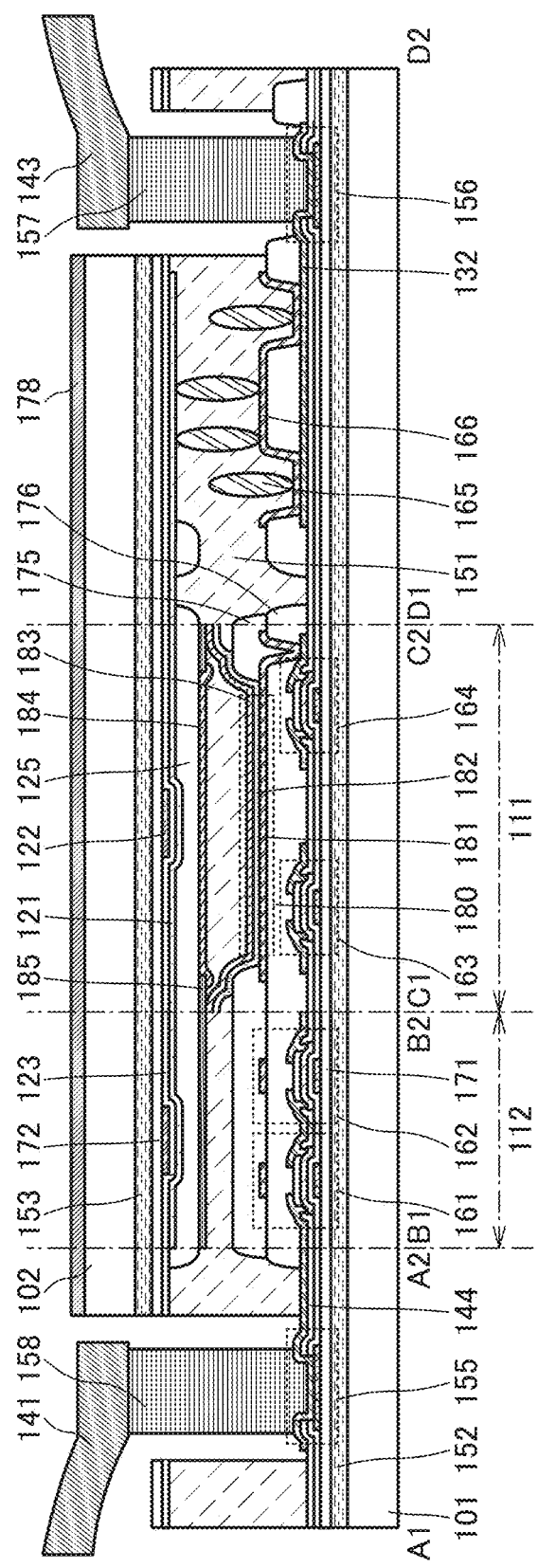
FIG. 3 illustrates an example of a structure of a touch panel.

The transistors 161, 162, 163, and 164 in FIG. 3 are channel-protective bottom-gate transistors. A protective layer covers the top surface of a semiconductor layer in each transistor, and the semiconductor layer is electrically connected to a source electrode or a drain electrode through an opening in the protective layer. With this structure, reduction in thickness of the semiconductor layer by etching for forming the source electrode and the drain electrode can be suppressed.

Figure 4:
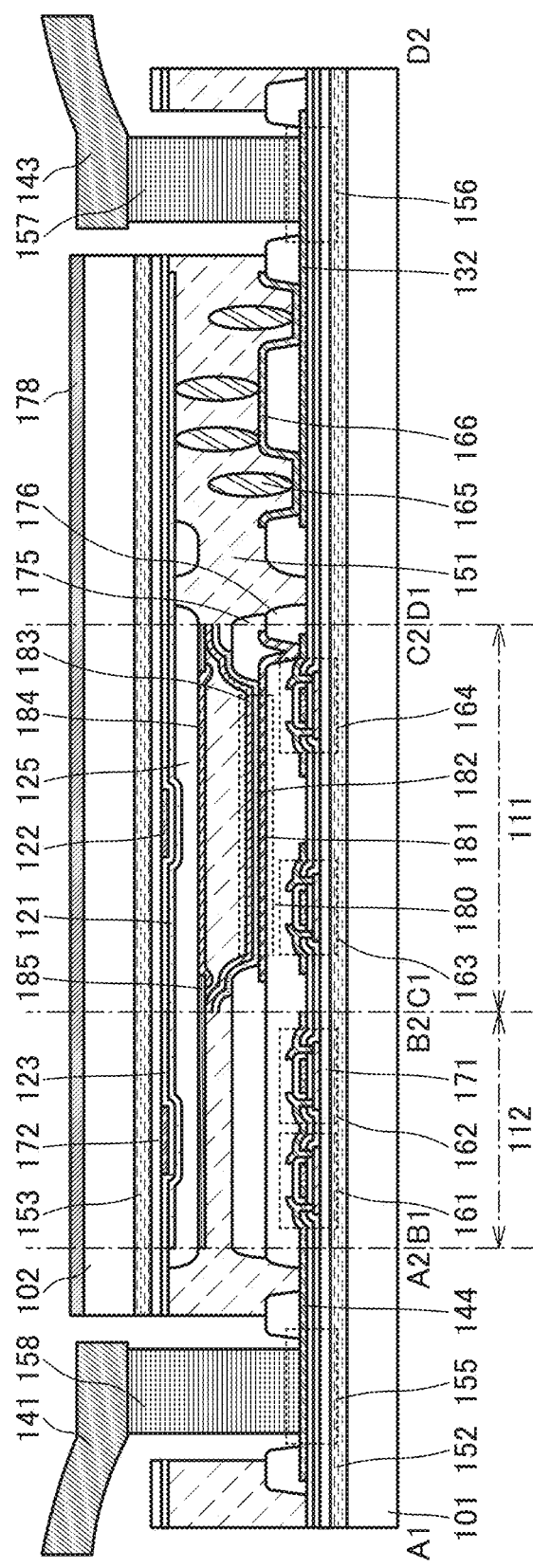
FIG. 4 illustrates an example of a structure of a touch panel.

The transistors 161, 162, 163, and 164 in FIG. 4 are top-gate transistors.

A bottom-gate structure is preferable when an oxide semiconductor is used for a semiconductor layer of a transistor. Because an oxide semiconductor can be formed at low temperature owing to its higher mobility than amorphous silicon, a range of choices of a gate electrode material can be widened regardless of the heat resistance of the gate electrode below the semiconductor layer. By using the bottom-gate structure, manufacturing steps can be simplified and manufacturing costs can be reduced as compared to a top-gate structure.

In particular, by using a CAAC-OS described later as an oxide semiconductor, the resistance of the oxide semiconductor against etching for forming the source and drain electrodes can be increased. In that case, a channel-etched structure is preferably used and manufacturing process can be more simplified.

When polycrystalline silicon or single crystal silicon transferred onto an insulating layer is used for a semiconductor layer of a transistor, a top-gate structure is preferable. In that case, a material with low heat resistance can be used for a wiring or an electrode over the semiconductor layer and a range of choices of the material can be widened. Note that when a high heat resistance material is used for a gate electrode or when polycrystalline silicon is formed at very low temperatures (e.g., lower than 450° C.), the bottom-gate structure is preferable because the number of manufacturing steps can be reduced.

The light-emitting element 180 includes the first electrode 181, a second electrode 183, and an EL layer 182 sandwiched between the first electrode 181 and the second electrode 183. The light-emitting element 180 is described below.

In the light-emitting element 180, a material transmitting light from the EL layer 182 is used for the electrode on the light emission side.

As the light-transmitting material, other than the above-described conductive oxide and graphene, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. A stacked film of the above materials can be used as the conductive layer. For example, a stacked film of indium tin oxide and an alloy of silver and magnesium is preferably used because the conductivity can be increased.

Such an electrode is formed by an evaporation method, a sputtering method, or the like. A discharging method such as an ink-jet method, a printing method such as a screen printing method, or a plating method may be used.

Note that when the above conductive oxide having a light-transmitting property is formed by a sputtering method, the use of a deposition atmosphere containing argon and oxygen allows the light-transmitting property to be increased.

In the case where the conductive oxide film is formed over the EL layer 182, a first conductive oxide film formed under an atmosphere containing argon with a reduced oxygen concentration and a second conductive oxide film formed under an atmosphere containing argon and oxygen are preferably stacked, in which case film formation damage to the EL layer 182 can be reduced. Here, the purity of an argon gas used for formation of the first conductive oxide film is preferably high, and for example, it is preferable to use the argon gas whose dew point is lower than or equal to −70° C., more preferably lower than or equal to −100° C.

For an electrode provided on a side opposite to the light exit side, a reflective material which reflects the light emission is used.

As a light reflective material, a metal material such as aluminum, gold, platinum, silver, nickel, tungsten, chromium, molybdenum, iron, cobalt, copper, or palladium or an alloy material containing any of these metal materials can be used. Alternatively, lanthanum, neodymium, germanium, or the like may be added to any of the above metal materials or the alloy materials. Examples of alloy materials include alloys containing aluminum (aluminum alloys) such as an alloy of aluminum and titanium, an alloy of aluminum and nickel, and an alloy of aluminum and neodymium, alloys containing silver such as an alloy of silver and copper, an alloy of silver, palladium, and copper, and an alloy of silver and magnesium, and the like. An alloy of silver and copper is preferable because of its high heat resistance. When a metal film or a metal oxide film is stacked to be in contact with a film containing aluminum, oxidation of the film containing aluminum can be suppressed. As examples of the metal material or the metal oxide material in contact with the film containing aluminum, titanium and titanium oxide can be given. Further alternatively, a film containing any of the above light-transmitting materials and a film containing any of the above metal materials may be stacked. For example, a stacked-film of silver and indium tin oxide, a stacked-film of an alloy of silver and magnesium and indium tin oxide, or the like can be used.

Such an electrode is formed by an evaporation method, a sputtering method, or the like. A discharging method such as an ink-jet method, a printing method such as a screen printing method, or a plating method may be used.

The EL layer 182 includes at least a layer containing a light-emitting organic compound (hereinafter also referred to as a light-emitting layer), and may be either a single layer or a multilayer. For example, an anode, a hole injection layer, a hole transport layer, a light-emitting layer, an electron transport layer, and an electron injection layer are stacked in this order can be used as the multilayer. Note that all of these layers except the light-emitting layer are not necessarily provided in the EL layer 182. Two or more of these layers may be provided in duplicate or more; specifically, in the EL layer 182, a plurality of light-emitting layers may be stacked. Another component such as a charge-generation region may be added as appropriate. Multilayer of light-emitting layers exhibiting different colors may be used. For example, a white emission can be obtained by stacking two or more light-emitting layers of complementary colors.

The EL layer 182 can be formed by a vacuum evaporation method, a discharging method such as an ink-jet method or a dispensing method, a coating method such as a spin-coating method, a printing method, or the like.

In this embodiment, a reflective material is used for the first electrode 181, and a light-transmitting material is used for the second electrode 183. Thus, the light-emitting element 180 is a top-emission light-emitting element, and emits light to the second substrate 102 side.

The above is the description of the light-emitting element 180.

The second electrode 122 constituting the touch sensor 120 is formed to be in contact with the second insulating layer 172. A dielectric layer 123 covers the second insulating layer 172. The first electrode 121 intersecting with the second electrode 122 is provided to be in contact with the dielectric layer 123.

For the first electrode 121 and the second electrode 122, any of the above-described light-transmitting conductive materials can be used.

The first electrode 121 and the second electrode 122 may be formed by depositing a light-transmitting conductive material on the insulating layer 172 by a sputtering method and then removing an unnecessary portion by any of various patterning techniques such as photolithography. Graphene may be formed in such a manner that a solution in which graphene oxide is dispersed is applied and reduced, in addition to a CVD method.

Examples of a material for the dielectric layer 123 are a resin such as acrylic or epoxy resin, a resin having a siloxane bond, and an inorganic insulating material such as silicon oxide, silicon oxynitride, or aluminum oxide.

In addition, an insulating layer 125 is provided to cover the first electrode 121, the dielectric layer 123, and the second electrode 122 which constitute the touch sensor 120. The insulating layer 125 serves as a planarization layer covering steps of the touch sensor 120 to form the color filter 184 with uniform thickness.

The insulating layer 125 also reduces the parasitic capacitance formed between a wiring or an electrode constituting the touch sensor 120 and a wiring or an electrode included in the display device 110. The insulating layer 125 is preferably formed using an organic material having a low relative permittivity. The thickness of the insulating layer 125 is, for example, 1 μm to 20 μm inclusive, preferably 1 μm to 10 μm to achieve both reduction in thickness of the touch panel 100 and reduction in parasitic capacitance.

The color filter 184 is formed over the insulating layer 125 overlapping the light-emitting element 180.

The color filter 184 is provided in order to adjust the color of light from a pixel to increase the color purity. For example, in a full-color display device using white light-emitting elements as the light-emitting element 180, a plurality of pixels provided with color filters of different colors are used for full-color display. In that case, the color filters may be those of three colors of red (R), green (G), and blue (B) or four colors (yellow (Y) in addition to these three colors). Further, a white (W) pixel may be added to R, G and B pixels (and a Y pixel), that is, color filters of four colors (or five colors) may be used.

A black matrix 185 is provided between the adjacent color filters 184. The black matrix 185 blocks light entering from adjacent pixels, thereby preventing color mixture between the adjacent pixels. The black matrix 185 may be provided only between adjacent pixels of different emission colors and not between pixels of the same emission color. Here, the color filter 184 is provided so that its end portion overlaps with the black matrix 185, whereby light leakage can be reduced. The black matrix 185 can be formed using a material that blocks light, for example, a metal material, a resin material including a pigment, or the like. Note that it is preferable to provide the black matrix 185 also in a region overlapping with the driver circuit 112 or the like besides the display portion 111 as illustrated in FIG. 2A, in which case undesired leakage of guided light or the like can be prevented.

It is preferable as shown in FIG. 2A that the first electrode 121 and the second electrode 122 constituting the touch sensor 120 be provided on the second substrate 102 side and the color filter 184 be provided on the other side close to the light-emitting element 180. With this structure, the distance between the touch sensor 120 and a touch surface can be reduced and the sensitivity of the touch sensor 120 is thus increased. Furthermore, the distance between the color filter 184 and the light-emitting element 180 is reduced, and light emitted from the light-emitting element 180 is prevented from traveling to enter the color filter 184 of an adjacent pixel.

The insulating layers 171 and 172 are preferably formed using a material preventing diffusion of impurities from the outside. For example, an inorganic insulating material is preferably used: oxide, nitride, or oxynitride of a semiconductor such as silicon oxide, silicon oxynitride, silicon nitride oxide, and silicon nitride; metal oxide, metal nitride, or metal oxynitride such as aluminum oxide, aluminum nitride or aluminum oxynitride. Alternatively, a multilayer of the inorganic insulating materials or a multilayer of the inorganic insulating material and an organic insulating material may be used.

The wiring 132 is provided over the insulating layer 171. The insulating layer 176 and the conductive layer 166 are provided over the wiring 132. The conductive layer 166 is electrically connected to the wiring 132 through an opening provided in the insulating layer 176. In FIG. 2A, the wiring 132 is formed by processing the conductive film used for forming the source electrode and the drain electrode of the transistor, and the conductive layer 166 is formed by processing the conductive film used for forming the first electrode 181 of the light-emitting element 180. The wiring 131 in FIGS. 1A to 1C preferably has a structure similar to the wiring 132.

On the second substrate 102 side, the electrode 121 of the touch sensor 120 extends above the conductive layer 166. The upper surface (the surface facing the conductive layer 166) includes part over which no element is provided other than the adhesive layer. The same can be applied to the electrode 122, but not illustrated.

The electrode 121 of the touch sensor 120 and the conductive layer 166 are electrically connected to each other via conductive particles 165. The conductive particles 165 disperse in the adhesive layer 151, and the electrode 121 and the wiring 132 are electrically connected by the conductive particles 165 and the conductive layer 166. The electrode 122 and the wiring 131 in FIGS. 1A to 1C are also electrically connected by the conductive particles 165.

As the conductive particles 165, particles of an organic resin, silica, or the like coated with a conductive material such as a metal material or an alloy material are preferably used. It is preferable to use nickel or gold as the metal material because contact resistance can be decreased. It is also preferable to use particles each coated with layers of two or more kinds of metal materials, such as particles coated with nickel and further with gold. Alternatively, particles of a conductive material may be used as the conductive particles 165.

It is preferable that the conductive particles 165 provided between the electrode 121 and the conductive layer 166 be deformed by being crushed under vertical pressure. By such deformation, the contact area between the conductive particles 165 and the electrode 121 (or the electrode 122) or the conductive layer 166 is increased, and resistance in the electrical connection can be reduced. Note that, for convenience, the conductive particles 165 are illustrated in the schematic cross-sectional view in FIG. 2A as having an elliptical cross-sectional shape with a long axis in a direction perpendicular to the substrates. However, in many actual cases, the conductive particles 165 have a circular cross-sectional shape or an elliptical cross-sectional shape with a long axis component in a direction parallel to the substrates. FIG. 2B shows the conductive particles 165 each having an elliptical cross-sectional shape with a long axis component in a direction parallel to the substrates.

In the outer portion of the substrate 101, part of the wiring 132 is included in the connection terminal 156. The connection terminal 156 in FIG. 2A has a multilayer structure including part of the wiring 132 and a conductive layer which is obtained by processing a conductive film used for forming the gate electrode of the transistor. By stacking layers as the connection terminal 156, mechanical strength against a pressure bonding step performed on the FPC 143 can be increased. The connection terminal 156 is electrically connected to the FPC 143 by a connection layer 157. For the connection layer 157, an anisotropic conductive film (ACF), anisotropic conductive paste (ACP), or the like can be used.

The wiring 144 which is electrically connected to the display portion 111 or the driver circuit 112 extends to the other outer portion of the substrate 101. Part of the wiring 144 in the outer portion of the substrate 101 is included in the connection terminal 155. The connection terminal 155 can have a structure similar to the above-described connection terminal 156, and is electrically connected to the FPC 141 by a connection layer 158.

The first substrate 101 and the insulating layer 171 are bonded by an adhesive layer 152, and the second substrate 102 and the insulating layer 172 are bonded by an adhesive layer 153.

The adhesive layers 152 and 153 can be formed using a material similar to that of the adhesive layer 151. For the adhesive layers, a curable resin such as a heat curable resin, a photocurable resin, or a two-component type curable resin can be used. For example, an acrylic resin, a urethane resin, an epoxy resin, or a resin having a siloxane bond can be used.

The same material is preferably used for at least two of the adhesive layers 151, 152, and 153, more preferably for all of them. By using the same materials for these adhesive layers, their linear thermal expansion coefficients can be the same and unintentional curve of the touch panel 100 can be prevented when heat temperature in manufacturing process or temperature in use is changed. Also, temperature range for guaranteed stable operating of the touch panel can be widened.

The thicknesses of at least two of, preferably all of the adhesive layers 151 to 153 are preferably substantially the same. For example, the smaller thickness between the two adhesive layers is more than or equal to 50% of the larger thickness, preferably more than or equal to 80%, further preferably more than or equal to 90%.

Like the adhesive layer 151, the adhesive layers 152 and 153 preferably include a region where the thickness is 50 nm to 10 µm inclusive, preferably 50 nm to 5 µm inclusive, further preferably 100 nm to 3 µm inclusive. By making the thicknesses of these three adhesive layers thin, the thickness of the touch panel 100 is reduced and a flexible touch panel can be achieved.

Figure 5:
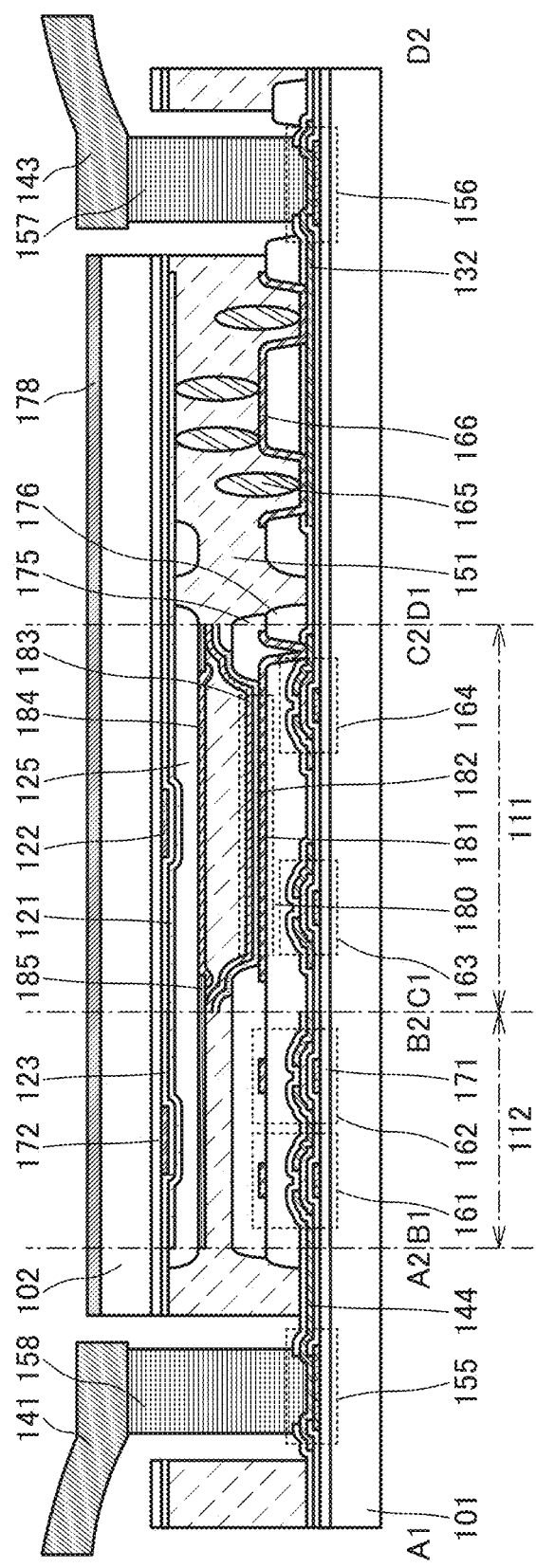
FIG. 5 illustrates an example of a structure of a touch panel.

A structure without one or both of the adhesive layers 152 and 153 may alternatively be used. FIG. 5 shows the structure without both of the adhesive layers 152 and 153. In FIG. 5, the insulating layer 171 and the insulating layer 172 are in contact with the upper surface of the flexible first substrate 101 and with the bottom surface of the second substrate 102, respectively. The structure here corresponds to the structure of FIG. 2A without the adhesive layers 152 and 153. Alternatively, the structure of FIG. 2A, FIG. 3, or FIG. 4 without one or both of the adhesive layers 152 and 153 may be employed.

It is preferable to provide a protective layer 178 on the surface of the substrate 102. The protective layer 178 can be referred to as a ceramic coat and protects the surface of the substrate 102 in operating the touch panel 100 by a finger or a stylus. The insulating layer 178 can be formed using, for example, an inorganic insulating material such as silicon oxide, aluminum oxide, yttrium oxide, or yttria-stabilized zirconia (YSZ). The protective layer 178 can be formed by a sputtering method, a sol-gel method, or the like. In particular, it is preferable to use an aerosol deposition method described later because a dense film can be formed and the mechanical strength of the protective layer 178 can be increased.

Here, a method for forming a flexible touch panel is described.

For convenience, a structure including a pixel and a driver circuit, a structure including an optical member such as a color filter, or a structure including a touch sensor is referred to as an element layer. The element layer includes a display element, for example, and may further include a wiring electrically connected to the display element and an element such as a transistor used in a pixel and a circuit.

Here, a support provided with an insulating surface over which an element layer is formed is called base material.

As a method for forming an element layer over a base material provided with an insulating surface having flexibility, there are a method in which an element layer is formed directly over a base material, and a method in which an element layer is formed over a supporting base material that is different from a base material and has stiffness, and then the element layer is separated from the supporting base material and transferred to the base material.

In the case where a material of the base material can withstand heating temperature in the process for forming the element layer, it is preferable that the element layer be formed directly over the base material, in which case a manufacturing process can be simplified. At this time, the element layer is preferably formed in a state where the base material is fixed to the supporting base material, in which case transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected so that separation at an interface between the supporting base material and the separation layer, at an interface between the separation layer and the insulating layer, or in the separation layer occurs.

For example, it is preferable that a stacked layer of a layer including a high-melting-point metal material, such as tungsten, and a layer including an oxide of the metal material be used as the separation layer, and a stacked layer of a plurality of layers as the insulating layer, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, etching of the separation layer, by dripping of a liquid into part of the separation interface to penetrate the entire separation interface, or the like. Alternatively, separation may be performed by heating the separation interface by utilizing a difference in coefficient of thermal expansion.

The peeling layer is not necessary in the case where peeling can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and peeling may be performed at an interface between the glass and the insulating layer. Alternatively, a metal layer may be provided between the supporting base material and the insulating layer formed of an organic resin, and peeling may be performed at the interface between the metal layer and the insulating layer formed of an organic resin by heating the metal layer by feeding current to the metal layer. In that case, the insulating layer formed of an organic resin can be used as a base material.

Examples of the base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose linear thermal expansion coefficient is low, for example, lower than or equal to 30 ppm/K is preferable, and a polyamide imide resin, a polyimide resin, or PET can be suitably used. A substrate in which a fibrous body is impregnated with a resin (also referred to as prepreg) or a substrate whose linear thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

The touch panel 100 of one embodiment of the present invention includes the display device 110 and the touch sensor 120 between a pair of flexible substrates. With this structure, the display device 110 and the touch sensor 120 can be located at the center of the touch panel 100 in the thickness direction. This suppresses the influence of bending stress generated by bending the touch panel 100 on the display device 110 and the touch sensor 120, and defects such as breakage by bending are suppressed to achieve the highly reliable touch panel 100.

Furthermore, in the touch panel 100 of one embodiment of the present invention, a terminal connecting a wiring of the touch sensor 120 and an FPC is provided on the substrate side where the display device 110 is formed, and the terminal is provided in the outer region of the touch panel other than the driver circuit region of the display device 110 is provided. With this structure, the degree of freedom in the position of FPC can be increased.

Figure 6A:
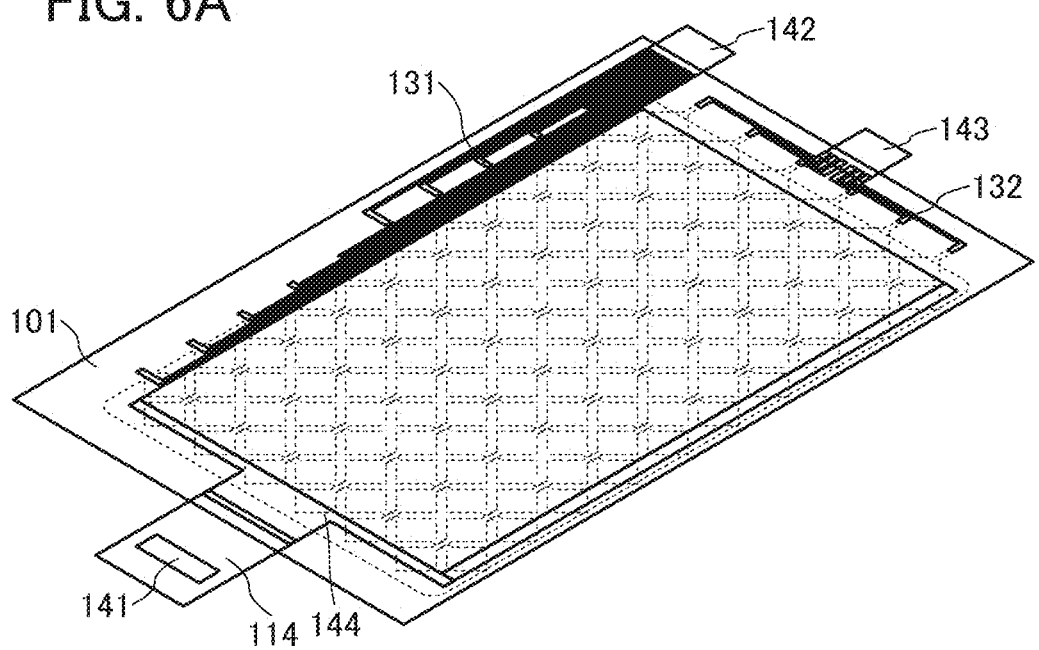
FIGS. 6A and 6B illustrate an example of a structure of a touch panel.
Figure 6B:
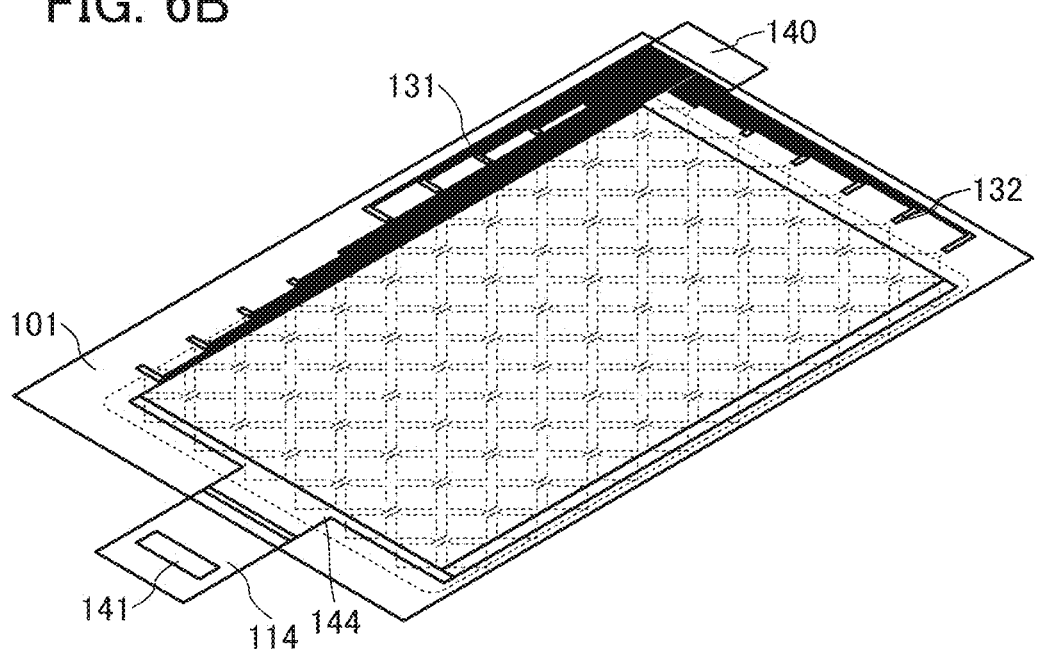

Note that the positions of the FPCs 141, 142, 143 are not limited to the positions in FIG. 1A and can be appropriately changed depending on the shape or specifications of an electronic device in which the touch panel 100 is incorporated. For example, as shown in FIG. 6A, the FPC 142 electrically connected to the wiring 131 may be positioned on the same side as the FPC 143. Although two FPCs of the FPC 142 and the FPC 143 are provided in FIG. 6A, they may be unified into an FPC 140 as shown in FIG. 6B. Alternatively, the FPCs 142 and 143 may be provided on the same side as the FPC 141 of the first substrate 101 (not shown).

Note that the display device in one embodiment of the present invention, an active matrix method in which an active element is included in a pixel or a passive matrix method in which an active element (non-linear element) is not included in a pixel can be used.

In the active matrix method, as an active element (a non-linear element), not only a transistor but also various active elements (non-linear elements), for example, a MIM (metal insulator metal), a TFD (thin film diode), or the like can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

Modification Example

A touch panel partly different from the above will be described below. Note that description of the portions already described in Embodiment 1 is omitted and only large different portions are described.

FIG. 7A is a schematic cross-sectional view of a touch panel described below.

Large differences between FIG. 7A and FIG. 2A are the type of a light-emitting element (bottom-emission type in FIG. 7A) and the position of a touch sensor.

An adhesive layer 192 is provided over the first substrate 101, and the insulating layer 172 is provided over the adhesive layer 192. The electrodes 121 and 122 and the dielectric layer 123 included in the touch sensor 120 and the like are provided over the insulating layer 172. The electrodes 121 and 122, the dielectric layer 123, and the like are provided below the insulating layer 171 with the adhesive layer 191 provided therebetween. In other words, the touch panel of FIG. 7A includes the touch sensor 120 between the display device 110 and the first substrate 101.

The light-emitting element 180 in FIG. 7A is a bottom-emission type light-emitting element. That is, emission from the light-emitting element 180 is extracted to the first substrate 101 side. The color filter 184 is provided closer to the first substrate 101 than the light-emitting element 180. In FIG. 7A, the color filter 184 is provided between the insulating layer 176 and an inorganic insulating layer covering a transistor. Note that a black matrix may cover a transistor and a wiring.

Over the first substrate 101, the connection terminal 156 connecting the electrode 121 of the touch sensor 120 and the FPC 143 (or the electrode 122 and the FPC 142). Unlike the driver circuit 112 and the display portion 111, the connection terminal 156 does not include the adhesive layer 191 and the elements over the adhesive layer 191, and at least part of the upper surface of the connection terminal 156 is exposed. As shown in FIG. 7A, the first substrate 101 preferably extends beyond the second substrate 102 at least in a direction where the connection terminal 156 is provided.

An insulating layer 173 is preferably provided on the bottom surface of the second substrate 102 (the surface on the light-emitting element 180 side) like the insulating layers 171 and 172.

The protective layer 178 is preferably provided on the surface of the first substrate 101 because the surface on the first substrate 101 side is a display surface and an operation surface.

As shown in FIG. 7B, the adhesive layer 192 between the first substrate 101 and the insulating layer 172 may be omitted and the insulating layer 172 may be directly formed on the upper surface of the first substrate 101.

The adhesive layers 191 and 192 may have structures similar to that of the adhesive layers 152 and 153.

Note that a transistor structure and a peripheral structure of the transistor are not limited to FIGS. 7A and 7B, and the above-described transistor structure and a stacked-layer structure of insulating layers in the peripheral thereof (e.g., the transistor structures in FIGS. 2A and 2B, FIG. 3, and FIG. 4) may be used.

The above is the description of the modification example.

At least part of this embodiment can be implemented in combination with any of the embodiments described in this specification as appropriate.

Embodiment 2

In this embodiment, a method for operating the touch panel of one embodiment of the present invention is described with reference to drawings.

[Example of Sensing Method by Sensor]

Figure 8A:
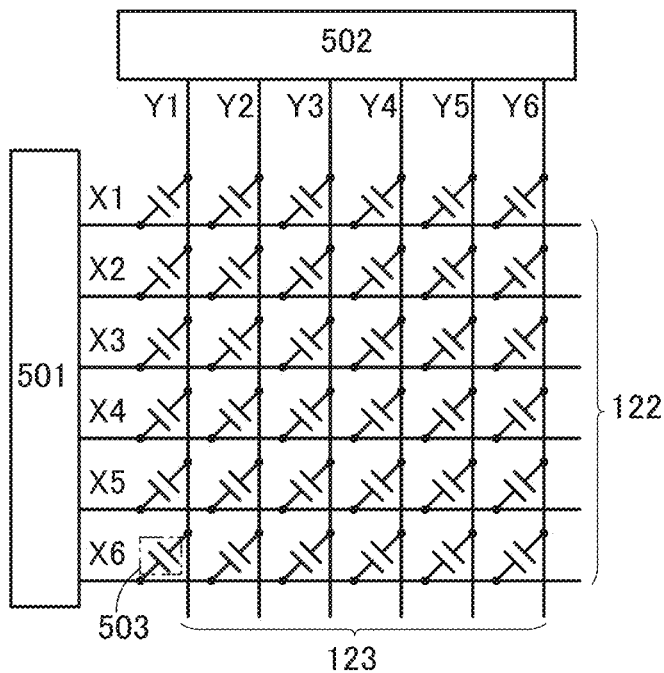
FIGS. 8A and 8B are a block diagram and a timing chart of a touch sensor.

FIG. 8A is a block diagram illustrating a structure of a mutual capacitive touch sensor portion. FIG. 8A illustrates a pulse voltage output circuit 501 and a current sensing circuit 502. Note that in FIG. 8A, six wirings X1 to X6 represent the electrodes 121 to which pulse voltage is applied, and six wirings Y1 to Y6 represent the electrodes 122 that detect changes in current. FIG. 8A also illustrates a capacitor 503 that is formed where the electrodes 121 and 122 overlap with each other. Note that functional replacement between the electrodes 121 and 122 is possible.

The pulse voltage output circuit 501 is a circuit for sequentially applying pulse voltage to the wirings X1 to X6. By application of pulse voltage to the wirings X1 to X6, an electric field is generated between the electrodes 121 and 122 forming the capacitor 503. When the electric field between the electrodes is shielded, for example, a change occurs in the capacitor 503 (mutual capacitance). The approaching or contact of an object can be sensed by utilizing this change.

The current sensing circuit 502 is a circuit for detecting changes in current flowing through the wirings Y1 to Y6 that are caused by the change in the capacitor 503 (mutual capacitance). No change in current value is sensed in the wirings Y1 to Y6 when there is no approaching or contact of an object, whereas a decrease in current value is detected when mutual capacitance is decreased owing to the approaching or contact of an object. Note that an integrator circuit or the like is used for sensing of current values.

Note that one or both of the pulse voltage output circuit 501 and the current sensing circuit 502 may be formed over the first substrate 101 in Embodiment 1. For example, it is preferable to form the display portion 111 and the driver circuit 112 at the same time because process can be simplified and the number of components of an electrical device to which the touch panel 100 is applied can be reduced. One or both of the pulse voltage output circuit 501 and the current sensing circuit 502 may be mounted on the FPCs (the FPCs 142 and 143 (or 140) electrically connected to the touch sensor 120 by a COF method.

In particular, when the semiconductor layers where channels of the transistors over the first substrate 101 are formed using crystalline silicon such as polycrystalline silicon or single crystal silicon, driving characteristics of the pulse voltage output circuit 501, the current sensing circuit 502, of the like are increased and sensitivity of the touch sensor can be thus increased.

Figure 8B:
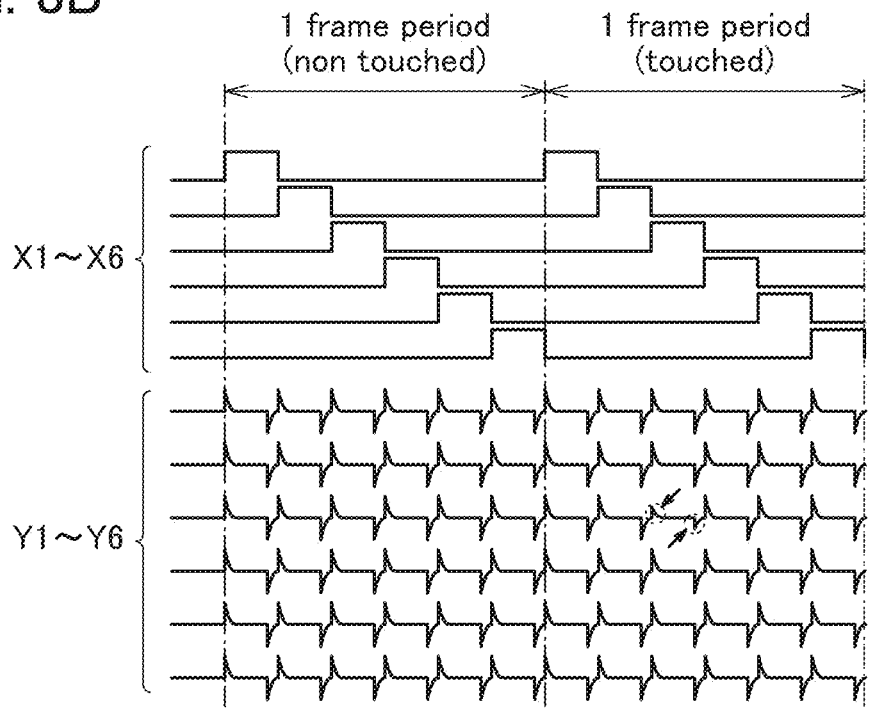

FIG. 8B is a timing chart of input and output waveforms in the mutual capacitive touch sensor portion shown in FIG. 8A. In FIG. 8B, sensing of an object is performed in all rows and columns in one frame period. FIG. 8B shows a period when an object is sensed (not touched) and a period when an object is not sensed (touched). Sensed current values of the wirings Y1 to Y6 are shown as waveforms of voltage values.

Pulse voltage is sequentially applied to the wirings X1 to X6, and waveforms of the wirings Y1 to Y6 change in accordance with the pulse voltage. When there is no proximity or contact of an object, the waveforms of the wirings Y1 to Y6 change in accordance with changes in the voltages of the wirings X1 to X6. The current value is decreased at the point of approach or contact of the object and accordingly the waveform of the voltage value changes.

By detecting a change in mutual capacitance in this manner, proximity or contact of an object can be sensed.

Figure 9:
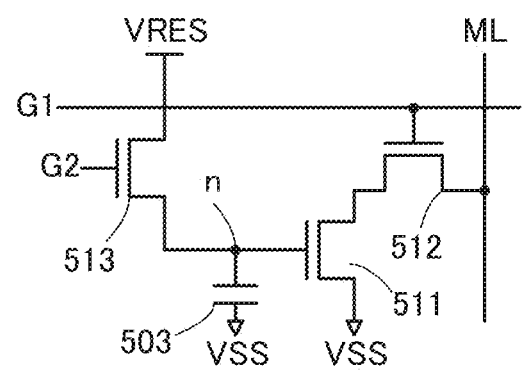
FIG. 9 is a circuit diagram of a touch sensor.

Although FIG. 8A is a passive matrix touch sensor in which only the capacitor 503 is provided at the intersection of wirings as a touch sensor, an active matrix touch sensor including a transistor and a capacitor may be used. FIG. 9 is a sensor circuit included in an active matrix touch sensor.

The sensor circuit includes the capacitor 503 and transistors 511, 512, and 513. A signal G2 is applied to a gate of the transistor 513. A voltage VRES is applied to one of a source and a drain of the transistor 513, and one electrode of the capacitor 503 and a gate of the transistor 511 are electrically connected to the other electrode of the capacitor 503. One of a source and a drain of the transistor 512 is electrically connected to one of a source and a drain of the transistor 511, and a voltage VSS is applied to the other of the source and the drain of the transistor 511. A signal G1 is applied to a gate of the transistor 512, and a wiring ML is electrically connected to the other of the source and the drain of the transistor 512. A voltage VSS is applied to the other electrode of the capacitor 503.

Next, the operation of the sensor circuit will be described. First, a potential for turning on the transistor 513 is applied as the signal G2, and a potential with respect to the voltage VRES is thus applied to the node n connected to the gate of the transistor 511. A potential for turning off the transistor 513 is then applied as the signal G2, whereby the potential of the node n is maintained.

Then, mutual capacitance of the capacitor 503 changes owing to the approach or contact of an object such as a finger, and accordingly the potential of the node n is changed from VRES.

In reading operation, a potential for turning on the transistor 512 is applied to the signal G1. Current flowing through the transistor 511, that is, current flowing through the wiring ML is changed according to the potential of the node n. By sensing this current, the approach or contact of an object can be sensed.

It is preferable that the transistors 511, 512, and 513 each include an oxide semiconductor in a semiconductor layer where a channel is formed. In particular, by using an oxide semiconductor in a semiconductor layer where a channel of the transistor 513 is formed, the potential of the node n can be held for a long time and the frequency of operation (refresh operation) of resupplying VRES to the node n can be reduced.

[Example of Driving Method for Display Device]

Figure 10A:
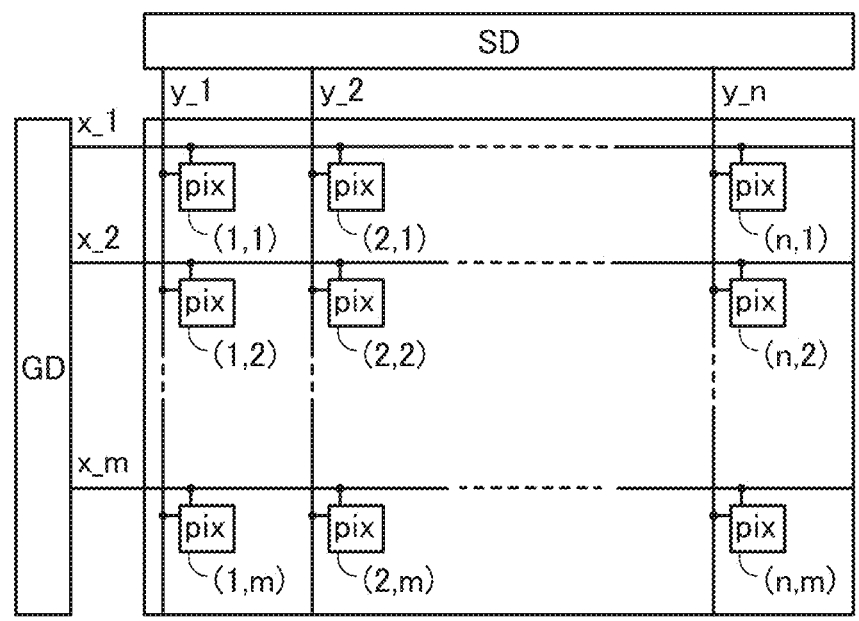
FIGS. 10A and 10B are a block diagram and a timing chart of a display device.

FIG. 10A is a block diagram illustrating an example of a structure of a display device. FIG. 10A illustrates a source driver circuit SD, a gate driver circuit GD, and a pixel pix. In FIG. 10A, gate lines x_1 to x_m (m is a natural number) electrically connected to the gate driver circuit D and source lines y_1 to y_n (n is a natural number) electrically connected to the source driver circuit SD are shown. Corresponding to these lines, the pixels pix are denoted by (1, 1) to (n, m).

Figure 10B:
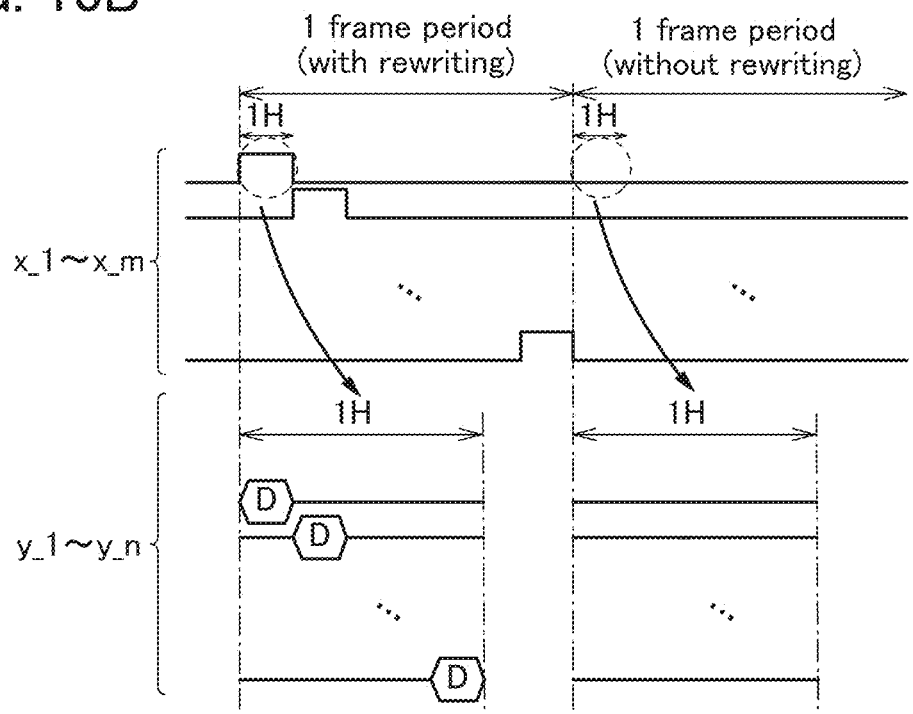

FIG. 10B is a timing chart of signals supplied to the gate lines and the source lines in the display device shown in FIG. 10A. The periods in FIG. 10B show the case where data signals are rewritten every frame period and the case where data signals are not rewritten. Note that periods such as a retrace period are not taken into consideration in FIG. 10B.

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, supply of scan signals to the gate lines x_1 to x_m is stopped. In the horizontal scanning period 1H, supply of data signals D to the source lines y_1 to y_n in the columns is stopped.

A driving method in which data signals are not rewritten every frame period is effective particularly when an oxide semiconductor is used for a semiconductor layer where a channel of a transistor included in a pixel is formed. A transistor including an oxide semiconductor can have much lower off-state current than a transistor including a semiconductor such as silicon. Thus, a data signal written in the previous period can be held without rewriting data signals every frame period, and grayscale of pixels can be held for 1 second or longer, preferably 5 seconds or longer, for example.

In the case where polycrystalline silicon is used for a semiconductor layer where a channel of a transistor included in a pixel is formed, the capacitance of the pixel is preferably increased in advance. The larger the capacitance is, the longer the grayscale of the pixel can be held. The storage capacitance may be determined depending on leakage current of a transistor or a display element which is electrically connected to the capacitor. For example, the storage capacitance per pixel is set to 5 fF 30 to 5 pF inclusive, preferably 10 fF to 5 pF inclusive, further preferably 20 fG to 1 pF inclusive, so that a data signal written in the previous period can be held without rewriting data signals every frame period. For example, grayscale of a pixel can be held for several frame periods or several tens of frame periods.

[Example of Driving Method for Display Device and Touch Sensor]

Figure 11A:
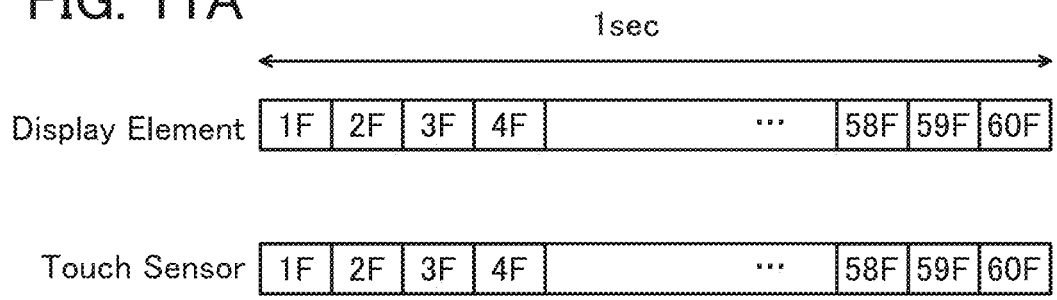
FIGS. 11A to 11D illustrate the operation of a display device and a touch sensor.

FIGS. 11A to 11D show examples of the operations in consecutive frame periods of the touch sensor described using FIGS. 8A and 8B and the display device described using FIGS. 10A and 10B that are driven for 1 sec. (one second). In FIG. 11A, one frame period for the display device is 16.7 ms (frame frequency: 60 Hz), and one frame period for the touch sensor is 16.7 ms (frame frequency: 60 Hz).

Figure 11B:
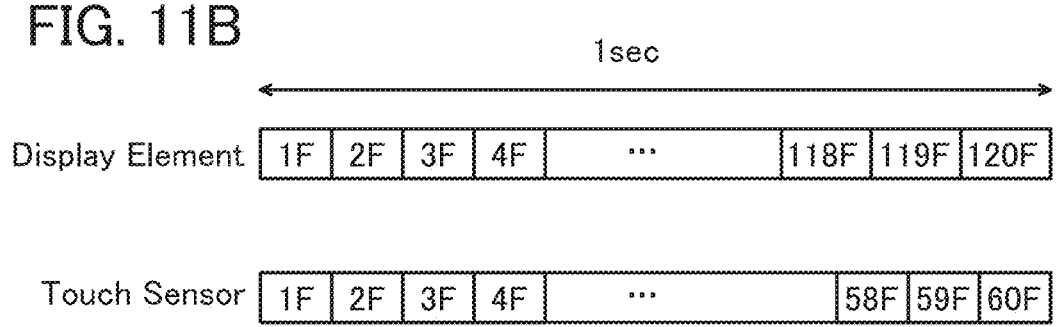

In the display device of this embodiment, the display device and the touch sensor operate independently of each other, and the touch sensor can have a touch sensing period concurrent with a display period. That is why one frame period for the display device and one frame period for the touch sensor can both be 16.7 ms (frame frequency: 60 Hz) as shown in FIG. 11A. The frame period for the touch sensor may differ from that of the display device. For example, as shown in FIG. 11B, one frame period for the display device is 8.3 ms (frame frequency: 120 Hz) and one frame period for the touch sensor is 16.7 ms (frame frequency: 60 Hz). The frame frequency for the display device may be 33.3 ms (frame frequency: 30 Hz) (not shown).

The frame frequency for the display device may be configured to be changeable, i.e., the frame frequency in displaying moving images is increased (e.g., 60 Hz or more, or 120 Hz or more), whereas the frame frequency in displaying still images is decreased (e.g., 60 Hz or less, 30 Hz or less, or 1 Hz or less). With this structure, power consumption of the display device can be suppressed. The frame frequency for the touch sensor may be configured to be changeable, and the frame frequency in waiting may differ from the frame frequency in sensing a touch.

The touch panel of this embodiment holds data signals rewritten in the previous period without rewriting data signals in the display device, and one frame period for the display device can thus be longer than 16.7 ms. Thus, as shown in FIG. 11C, the operation can be switched so that one frame period for the display device is 1 sec (frame frequency: 1 Hz) and one frame period for the touch sensor is 16.7 ms (frame frequency: 60 Hz).

Figure 11C:
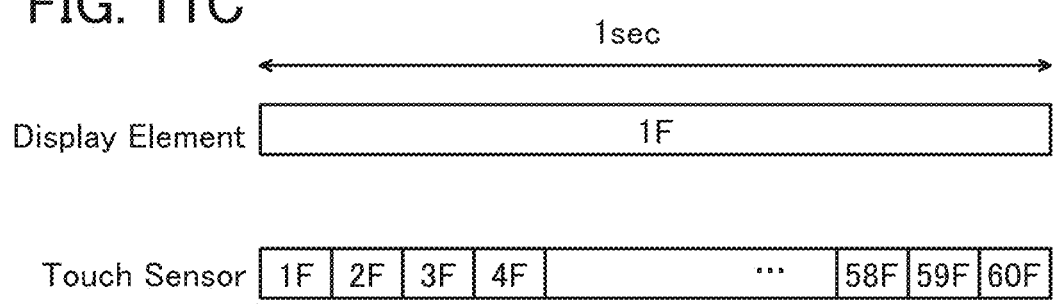
Figure 11D:
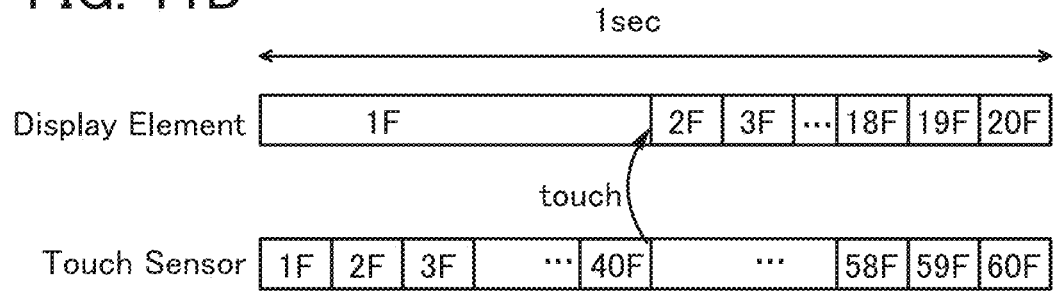

Furthermore, the touch panel of this embodiment can continue to operate the touch sensor in the driving shown in FIG. 11C. Thus, data signals in the display device can be rewritten at the timing at which the approach or contact of an object is sensed in the touch sensor, as shown in FIG. 11D.

If rewriting of data signal in a display device is performed during a sensing period of a touch sensor, noise caused by operating the display device travels through the touch sensor and the sensitivity of the touch sensor might decrease. For this reason, rewriting of data signal in a display device and sensing in a touch sensor are preferably performed in different periods.

Figure 12A:
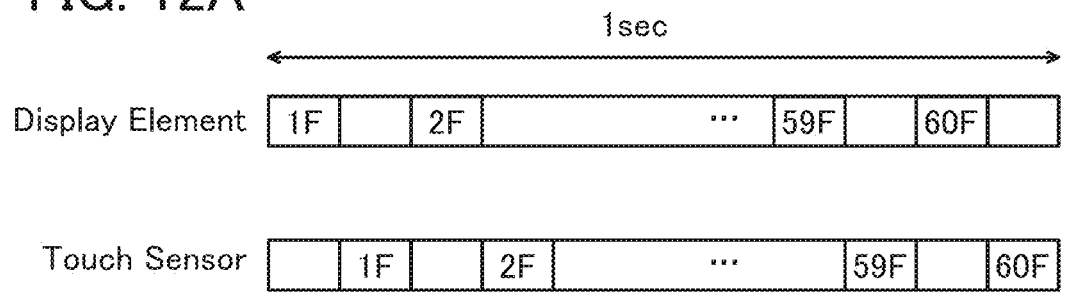
FIGS. 12A to 12D illustrate the operation of a display device and a touch sensor.
Figure 12B:
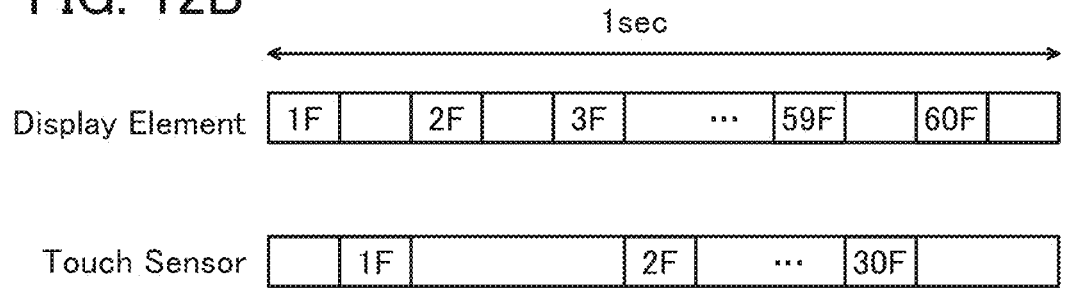

FIG. 12A shows an example in which rewriting of data signal in a display device and sensing in a touch sensor are performed alternately. FIG. 12B shows an example in which sensing in a touch sensor is performed one time every two rewritings of data signal in a display device. Note that sensing in a touch sensor may be performed once every three or more rewritings.

With use of an oxide semiconductor as a semiconductor layer including a channel of a transistor used in a pixel of a display device, off-state current can be reduced and the frequency of rewriting data signal can be sufficiently reduced. Specifically, a sufficiently long break period can be set between rewritings of data signal. The break period is 0.5 seconds or longer, 1 seconds or longer, or 5 seconds or longer, for example. The upper limit of the break period depends on leakage current of a capacitor or a display element connected to a transistor; for example, 1 minutes or shorter, 10 minutes or shorter, 1 hour or shorter, or 1 day or shorter.

Figure 12C:
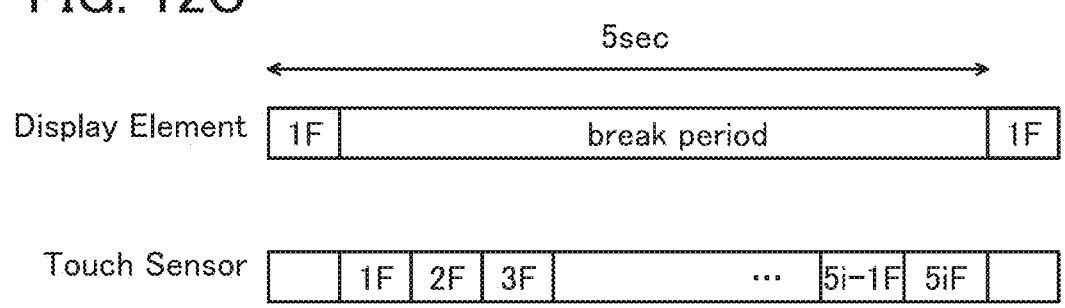
Figure 12D:
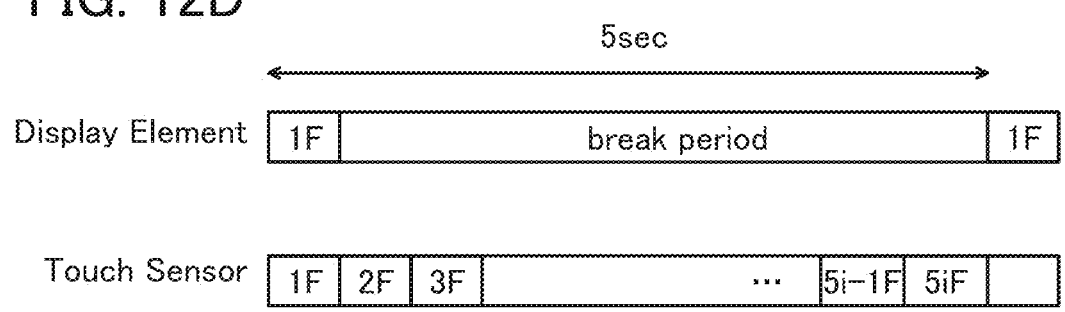

FIG. 12C shows an example in which rewriting of data signal in a display device is performed once every 5 seconds. A break period for stopping operation of a display device is set in FIG. 12C between rewriting of data signal and next rewriting. In the break period, a touch sensor can be operated at a frame frequency of iHz (i is more than or equal to the frame frequency of a display device; here, 0.2 Hz or more). Sensing in a touch sensor is performed in a break period and is not performed in rewriting period of data signal in a display device as shown in FIG. 12C, so that sensitivity of a touch sensor can be increased. When rewriting of data signal and sensing are performed at the same time as shown in FIG. 12D, operation signal can be simplified.

In a break period during which rewriting of data signal in a display device is not performed, only the supply of signal to a driver circuit may be stopped, and in addition, the supply of power potential may be stopped for further reducing power consumption.

As described in Embodiment 1, the touch panel of one embodiment of the present invention includes a display device and a touch sensor between two flexible substrates. With this structure, the distance between the display device and the touch sensor can be reduced. A decrease in sensitivity of the touch sensor caused by noise generated by driving the display device can be suppressed by employing the driving method in this embodiment, and both reduction in thickness and high sensitivity of a touch panel are achieved.

Embodiment 3

In this embodiment, a structure example of a touch panel of one embodiment of the present invention and an example of a method for driving the touch panel are described with reference to drawings.

[Structure Example of Touch Panel]

Figure 13:
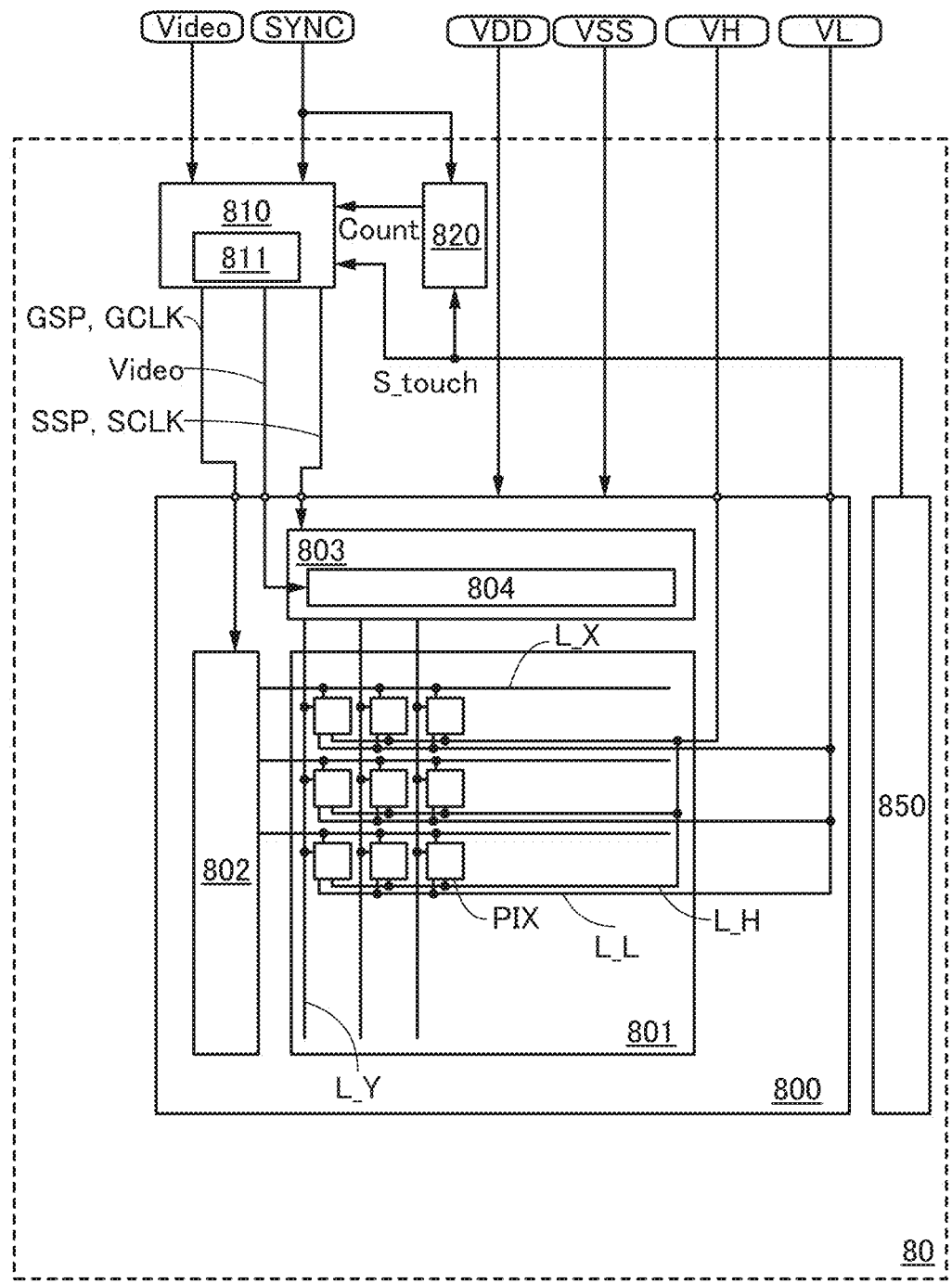
FIG. 13 is a block diagram of a touch panel.

FIG. 13 is a block diagram of a structure of a touch panel 80 including a display device 800, a control circuit 810, a counter circuit 820, and a touch sensor 850.

An image signal (Video), which is digital data, and a synchronization signal (SYNC) for controlling rewriting of a screen of the display device 800 are input to the touch panel 80. Examples of a synchronization signal include a horizontal synchronization signal (Hsync), a vertical synchronization signal (Vsync), and a reference clock signal (CLK).

The display device 800 includes a display portion 801, a gate driver 802, and a source driver 803. The display portion 801 includes a plurality of pixels PIX. The pixels PIX in the same row are connected to the gate driver 802 through a common gate line L_X, and the pixels PIX in the same column are connected to the source driver 803 through a common source line L_Y.

A high-level potential (VH), a low-level potential (VL), and a high power supply potential (VDD) and a low power supply potential (VSS) which serve as power supply potentials are supplied to the display device 800. The high-level potential (VH) is supplied to each pixel PIX in the display portion 801 through a common line L_H. The low-level potential (VL) is supplied to each pixel PIX in the display portion 801 through a line L_L.

The source driver 803 processes an input image signal to generate a data signal, and outputs the data signal to the source line L_Y. The gate driver 802 outputs, to the gate line L_X, a scan signal for selecting the pixel PIX into which a data signal is to be written.

The pixel PIX includes a switching element whose electrical connection to the source line L_Y is controlled by a scan signal. When the switching element is turned on, a data signal is written into the pixel PIX through the source line L_Y.

The control circuit 810 controls the whole touch panel 80 and includes a circuit which generates control signals for circuits included in the touch panel 80.

The control circuit 810 includes a control signal generation circuit which generates control signals for the gate driver 802 and the source driver 803 on the basis of the synchronization signal (SYNC). Examples of a control signal for the gate driver 802 include a start pulse (GSP) and a clock signal (GCLK). Examples of a control signal for the source driver 803 include a start pulse (SSP) and a clock signal (SCLK). For example, the control circuit 810 generates a plurality of clock signals with the same cycle and shifted phases as the clock signals (GCLK and SCLK).

Further, the control circuit 810 controls output of an image signal (Video), which is input from the outside of the touch panel 80, to the source driver 803.

A sensor signal (S_touch) is input to the control circuit 810 from the touch sensor 850, and the control circuit 810 corrects an image signal in accordance with the sensor signal. The correction of the image signal is based on the sensor signal; image processing corresponding to touch operation is performed.

The source driver 803 includes a digital/analog conversion circuit 804 (hereinafter referred to as a D-A conversion circuit 804). The D-A conversion circuit 804 converts an image signal to an analog signal, thereby generating a data signal.

Note that in the case where an image signal input to the touch panel 80 is an analog signal, the image signal is converted to a digital signal in the control circuit 810 and output to the display device 800.

An image signal is image data for each frame. The control circuit 810 has a function of performing image processing on the image data and controlling output of the image signal to the source driver 803 on the basis of data obtained by the processing. For that function, the control circuit 810 includes a motion sensing portion 811 which performs image processing on the image data to detect motion in the image data for each frame. In the case where a sensor signal is input, the image signal is corrected in accordance with the image signal.

When the motion sensing portion 811 determines that there is motion, the control circuit 810 continues to output image signals to the source driver 803. The control circuit 810 stops output of image signals to the source driver 803 when the motion sensing portion 811 determines that there is no motion, and restarts the output of image signals when the motion sensing portion 811 determines that there is motion.

The control circuit 810 controls display in the display portion 801 by switching between a first mode for displaying images with motion (moving image display) and a second mode for displaying images without motion (still image display) based on determination by the motion sensing portion 811. In the first mode, when the frequency of the vertical synchronization signal (Vsync) is 60 Hz, for example, the frame frequency is set to 60 Hz or higher. In the second mode, when the frequency of the vertical synchronization signal (Vsync) is 60 Hz, for example, the frame frequency is set to lower than 60 Hz.

The frame frequency in the second mode is preferably set in advance in accordance with a voltage holding property of a pixel. For example, when the motion sensing portion 811 determines that there is no motion for a certain period of time and the control circuit 810 stops the output of image signals to the source driver 803, a voltage corresponding to a gray level of an image signal that is written in the pixel PIX is lowered. Therefore, it is preferable to write in a voltage corresponding to a gray level of an image signal for the same image in accordance with the frame frequency (such operation is also called refresh operation). The timing of the refresh operation (also referred to as refresh rate) is set such that the refresh operation is performed every certain period of time. The timing is based on, for example, a signal obtained by counting the H level of the vertical synchronization signal (Vsync) in the counter circuit 820.

In the case where the refresh rate is set to once every second, when the frequency of the vertical synchronization signal (Vsync) is 60 Hz, for example, refresh operation is performed in response to a count signal (Count) that is output after the counter circuit 820 counts the H level of the vertical synchronization signal (Vsync) up to 60. In the case where the refresh rate is set to once every five seconds, when the frequency of the vertical synchronization signal (Vsync) is 60 Hz, for example, refresh operation is performed in response to a count signal (Count) that is output after the counter circuit 820 counts the H level of the vertical synchronization signal (Vsync) up to 300. Further, the following operation is possible: when a sensor signal is input from the touch sensor portion 850, the counter circuit 820 forcibly switches the control circuit 810 from the second mode to the first mode in accordance with the sensor signal.

Note that there is no particular limitation on the image processing for detecting motion which is performed in the motion sensing portion 811. An example of a method for detecting motion is to obtain difference data from image data for two consecutive frames. It can be determined whether there is motion or not from the obtained difference data. Another example of the method is to detect a motion vector.

The operation and structure of the touch sensor portion described in the above embodiment can be applied to the touch sensor portion 850.

The display device and the touch sensor 850 of this embodiment operate independently of each other; thus, the touch sensor portion 850 can have a touch sensing period concurrent with a display period. Even in the structure in which the control circuit 810 switches between the first mode and the second mode, the operation of the touch sensor portion can be thus controlled independently of those modes. By synchronizing the operation of the display device 800 with the operation of the touch sensor 850 and performing rewriting of data signal in the display device 800 and sensing in the touch sensor 850 in different periods, sensitivity of sensing can be increased.

[Structure Example of Pixel]

Figure 14A:
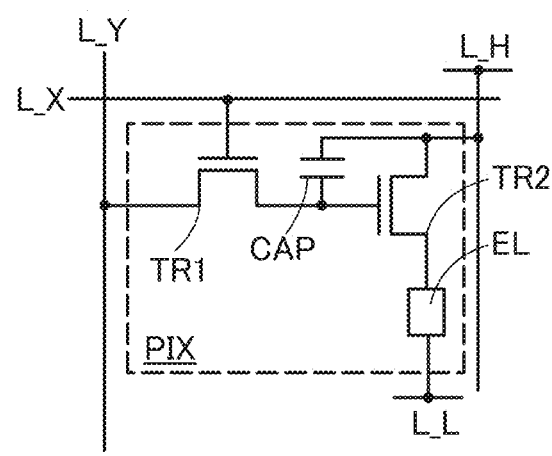
FIGS. 14A and 14B are circuit diagrams of a pixel.

FIG. 14A is a circuit diagram illustrating a structural example of the pixel PIX. The pixel PIX includes a transistor TR1, a transistor TR2, a light-emitting element EL, and a capacitor CAP.

The transistor TR1 is a switching element which controls electrical connection between the source line L_Y and the gate of the transistor TR2. The transistor TR1 is turned on or off by a scan signal input to its gate. The transistor TR2 is a switching element which controls current supplied to the light-emitting element EL.

Note that an oxide semiconductor or polycrystalline silicon is preferably used for a semiconductor layer where a channel is formed in the transistors TR1 and TR2.

The light-emitting element EL includes an EL layer containing a light-emitting organic compound between two electrodes. The emission luminance of the light-emitting element depends on current flowing through the electrodes. A low-level potential is applied from the wiring L_L to one electrode of the light-emitting element, and a high-level potential is applied from the wiring L_H to the other electrode via the transistor TR2.

The capacitor CAP retains the potential of the gate of the transistor TR2.

Figure 14B:
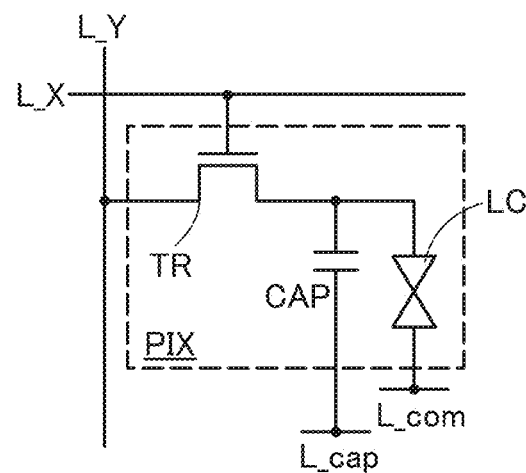

FIG. 14B is an example of the pixel PIX including a liquid crystal element. The pixel PIX includes a transistor TR, a liquid crystal element LC, and a capacitor CAP.

The transistor TR is a switching element which controls electrical connection between one electrode of the liquid crystal element LC and the source line L_Y. The transistor TR is turned on or off by a scan signal input to its gate.

Note that an oxide semiconductor or polycrystalline silicon is preferably used for a semiconductor layer where a channel is formed in the transistor TR.

The liquid crystal element LC includes two electrodes and a liquid crystal. The alignment of the liquid crystal is changed by the action of an electric field between the two electrodes. One of the two electrodes of the liquid crystal element LC, which is connected to the source line L_Y via the transistor TR, is a pixel electrode, and the other, which is connected to the common line L_com to which Vcom is applied, is a common electrode.

The capacitor CAP is connected parallel to the liquid crystal element LC. Here, one electrode of the capacitor is an electrode connected to a source or a drain of the transistor TR, and the other electrode of the capacitor is connected to the capacitor line L_cap to which the capacitor line voltage is applied.

Note that although the light-emitting element LC or the light-emitting element EL is used as a display element here, one embodiment of the present invention is not limited thereto.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a w % bite LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, or a carbon nanotube. Note that examples of display devices having EL elements include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. For example, some or all of pixel electrodes are formed to contain aluminum, silver, or the like. In such a case, a memory circuit such as an SRAM can be provided under the reflective electrodes, leading to lower power consumption.

[Example of Driving Method for Touch Panel]

Figure 15:
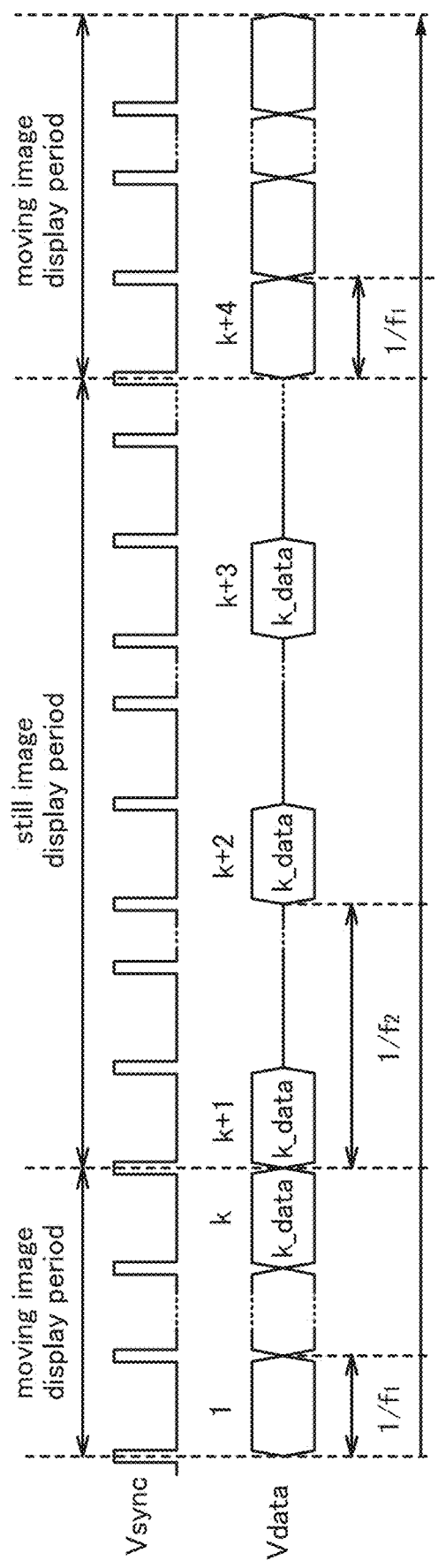
FIG. 15 is a timing chart illustrating operation of a display device.

Next, the operation of the touch panel 80, which performs display in the first mode for moving image display and in the second mode for still image display, is described with reference to a timing chart in FIG. 15. FIG. 15 shows the signal waveforms of a vertical synchronization signal (Vsync) and a data signal (Vdata) that is output to the source line L_Y from the source driver 803.

FIG. 15 is a timing chart of the touch panel 80. In FIG. 15, for example, moving image display, still image display, and moving image display are performed in that order. Here, there is motion in image data for the first to k-th frames. There is no motion in image data for the (k+1)-th to (k+3)-th frames. There is motion in image data for the (k+4)-th frame and frames after the (k+4)-th frame. Note that k is an integer of 2 or more.

In the first moving image display period, the motion sensing portion 811 determines that there is motion in image data for each frame, and the touch panel 80 operates in the first mode. The control circuit 810 outputs image signals (Video) to the source driver 803 at a frame frequency ($f_1$) that is higher than or equal to the frequency of the vertical synchronization signal. The source driver 803 continuously outputs data signals (Vdata) to the source line L_Y. Note that the length of one frame period in the moving image display period is represented by $1/f_1$ (seconds).

Next, in the still image display period, the motion sensing portion 811 performs image processing for detecting motion and determines that there is no motion in image data for the (k+1)-th frame, and the touch panel 80 operates in the second mode. The control circuit 810 outputs image signals (Video) to the source driver 803 at a frame frequency ($f_2$) that is lower than the frequency of the vertical synchronization signal. The source driver 803 intermittently outputs data signals (Vdata) to the source line L_Y. Note that the length of one frame period in the still image display period is represented by $1/f_2$ (seconds).

Since the source driver 803 intermittently outputs data signals (Vdata), supply of control signals (e.g., a start pulse signal and a clock signal) to the gate driver 802 and the source driver 803 can also be performed intermittently; thus, the operations of the gate driver 802 and the source driver 803 can be stopped periodically.

The intermittent output of data signals (Vdata) to the source line L_Y in the second mode is specifically described. For example, as shown in FIG. 15, in the (k+1)-th frame, the control circuit 810 outputs control signals to the gate driver 802 and the source driver 803 and outputs image signals (Video) to the source driver 803 at the frame frequency $f_2$. The source driver 803 outputs the data signal written in the previous period, that is, the data signal (k_data) output to the source line L_Y in the k-th frame, to the source line L_Y. In this manner, in the still image display period, the data signal (k_data) written in the previous period is repeatedly written in the source line L_Y every $1/f_2$ seconds. Thus, a voltage corresponding to a gray level of an image signal for the same image can be written in (i.e., refresh operation can be performed). The periodic refresh operation can reduce flickers due to shift of gray levels caused by a voltage drop and can improve the display quality of the touch panel.

The control circuit 810 operates in the second mode until the motion sensing portion 811 determines that there is motion in image data or until a sensor signal is input.

Then, when the motion sensing portion 811 determines that there is motion in image data for the (k+4)-th frame and frames after the (k+4)-th frame, the touch panel 80 operates in the first mode again. The control circuit 810 outputs image signals (Video) to the source driver 803 at a frame frequency ($f_1$) that is higher than or equal to the frequency of the vertical synchronization signal. The source driver 803 continuously outputs data signals (Vdata) to the source line L_Y.

As described in Embodiment 1, the touch panel of one embodiment of the present invention includes a display device and a touch sensor between two flexible substrates. With this structure, the distance between the display device and the touch sensor can be reduced. A decrease in sensitivity of the touch sensor caused by noise generated by driving the display device can be suppressed by employing the driving method in this embodiment, and both reduction in thickness and high sensitivity of a touch panel are achieved.

At least part of this embodiment can be implemented in combination with any of the embodiments described in this specification as appropriate.

Embodiment 4

In this embodiment, an example in which a protective film and the like is deposited on the surface of the member such as the touch panel described above by an aerosol deposition method will be described.

The aerosol deposition (AD) method is a deposition method without heating a substrate. The aerosol means microparticles dispersed in a gas.

Figure 16A:
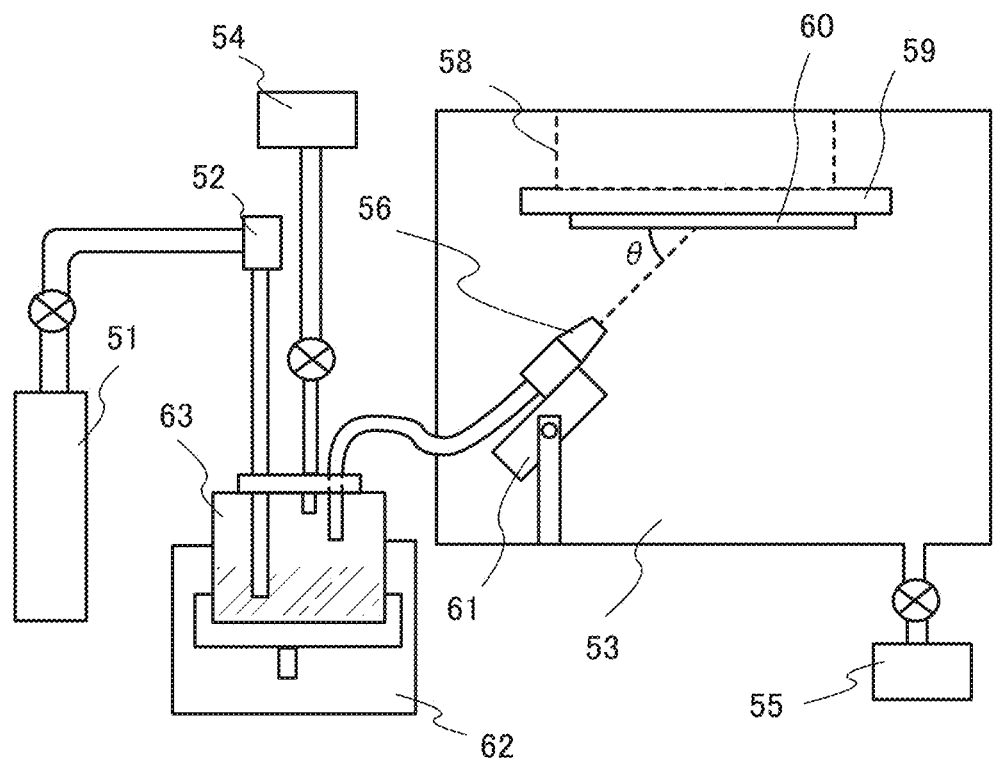
FIGS. 16A and 16B are a cross-sectional view of an apparatus and a perspective view of a nozzle.

FIG. 16A illustrates a cross-sectional structure of a deposition apparatus for aerosol deposition.

The deposition apparatus includes at least a chamber 53, a stage 59 for holding a subject where a film is deposited (e.g., a substrate 60), an evacuation unit 55 such as a pump (a mechanical booster pump, a rotary pump, or the like) for evacuating the chamber 53, a spray unit (e.g., a nozzle 56), a material container 63 connected to the spray unit via a supply line, a gas line for introducing a carrier gas, and a gas tank 51.

First, vibration (e.g., ultrasonic wave) is applied by a vibrator 62 to material powder in the material container 63, and heating is performed to remove moisture in the material container 63. The moisture is evacuated by an evacuation unit 54 via an evacuation line.

Then, a carrier gas is introduced into the material container 63 via the gas line to aerosolize the material powder. As the carrier gas, dry air, oxygen, or inert gas (e.g., nitrogen, helium gas, argon gas) is used, and a flow rate of the carrier gas is adjusted with a flowmeter 52.

In the chamber 53 whose pressure is reduced by the evacuation unit 55, aerosol containing inorganic fine particles (50 nm to 500 nm inclusive) is sprayed from the nozzle 56 onto the substrate 60 and is solidified to form an inorganic material layer on the surface of the substrate 60. This deposition method is referred to as an AD method. The positions of the subject (e.g., substrate 60) and the nozzle 56 are appropriately adjusted so that aerosol sprayed from the nozzle 56 collides with the subject (e.g., substrate 60) at a predetermined incident angle θ (θ is 0° to 90° inclusive). As the incident angle is increased, an impact force of fine particles that collide with the surface of the substrate 60 is likely to be large. On the other hand, as the incident angle is decreased, mechanical effect including the impact force of fine particles with respect to the surface of the substrate 60 is decreased. An optimal incident angle θ at which aerosol is sprayed onto the subject (e.g., substrate 60) may be different depending on a material of fine particles which are used, and it is thus important to adjust the incident angle θ.

In the apparatus of FIG. 16A, the incident angle θ is fixed with an angle adjustment unit 61, but without limitation to this, an apparatus may be configured to fix a nozzle and to adjust the angle of the stage 59.

Figure 16B:
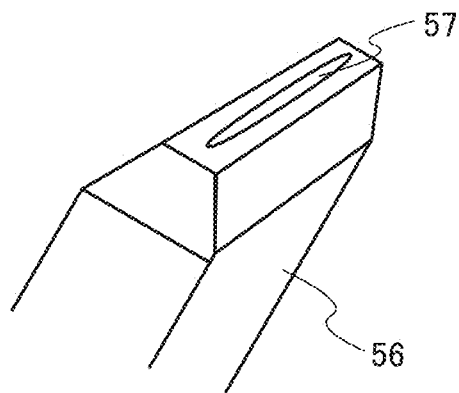

FIG. 16B is an enlarged perspective view of a top portion of the nozzle 56. A wide nozzle outlet 57 is shown here, but without limitation to this, a nozzle with a plurality of nozzle outlets may be used.

Selective deposition is also possible by providing a mask including an opening between the nozzle 56 and the substrate 60. Wider deposition is also possible by moving the stage 59 in the X direction or the Y direction with a driver unit 58 to move the substrate 60 in the X direction or the Y direction accordingly.

Inorganic materials such as aluminum oxide, yttrium oxide, aluminum nitride, silicon carbide, silicon nitride, and titanium oxide can be used as the material of the fine particles for an AD method.

By an aerosol deposition (AD) method, deposition at low temperatures (e.g., at room temperature) on a surface of a resin substrate or an organic material layer is achieved. In an aerosol deposition (AD) method, a film grows by repetition of such a phenomenon that fine particles collide on a substrate surface and are plastically deformed, and in some cases are cracked and pressed on the substrate.

In this embodiment, a film formed by an aerosol deposition method can be used as the protective layer 178 on the substrate surface on the touch sensor side in the touch panel 100, for example. For example, the protective layer 178 is formed by stacking an aluminum oxide film with a thickness of 100 nm to 200 nm inclusive on an aramid film by an aerosol deposition method. A film obtained by an aerosol deposition method is dense and fine unevenness is formed on the film surface in the deposition; thus, a protective film with high adhesion can be achieved.

Embodiment 5

In this embodiment, examples of electronic devices that can be manufactured according to one embodiment of the present invention will be described with reference to FIGS. 17A to 17D and FIGS. 18A to 18I.

Examples of an electronic appliance include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pinball machine.

The device fabricated by employing the peeling method of one embodiment of the present invention has flexibility and therefore can be incorporated along a curved inside/outside wall surface of a house or a building or a curved interior/exterior surface of a car.

Figure 17A:
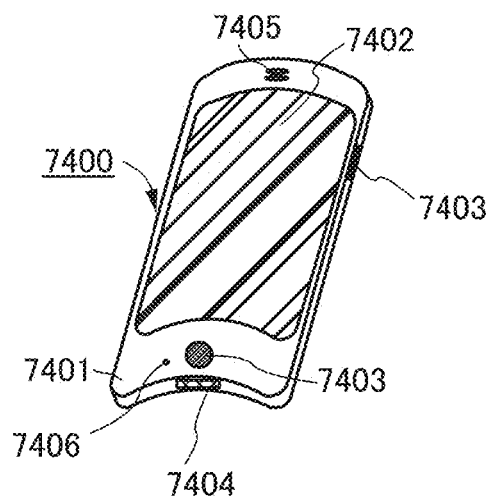
FIGS. 17A to 17D are structure examples of electronic devices.

FIG. 17A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the cellular phone 7400 is fabricated using the display device fabricated by employing the peeling method of one embodiment of the present invention for the display portion 7402. One embodiment of the present invention enables a highly reliable mobile phone having a curved display portion to be provided with a high yield.

When the display portion 7402 of the mobile phone 7400 illustrated in FIG. 17A is touched with a finger or the like, data can be input into the mobile phone 7400. In addition, operations such as making a call and inputting a letter can be performed by touch on the display portion 7402 with a finger or the like.

With the operation buttons 7403, the power can be turned on or off. In addition, types of images displayed on the display portion 7402 can be switched; switching images from a mail creation screen to a main menu screen.

Figure 17B:
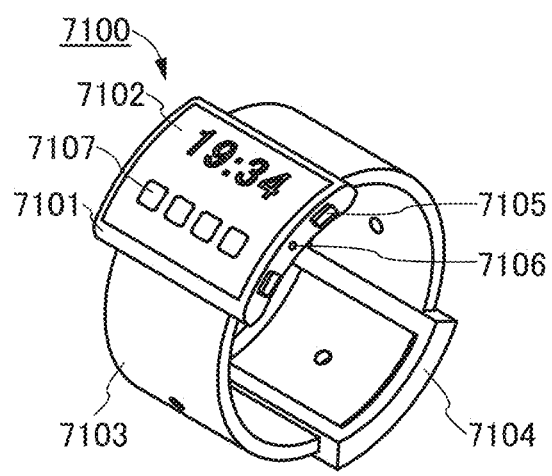

FIG. 17B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as ON/OFF of the power, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device fabricated by using one embodiment of the present invention. One embodiment of the present invention enables a highly reliable portable information terminal having a curved display portion to be provided with a high yield.

Figure 17C:
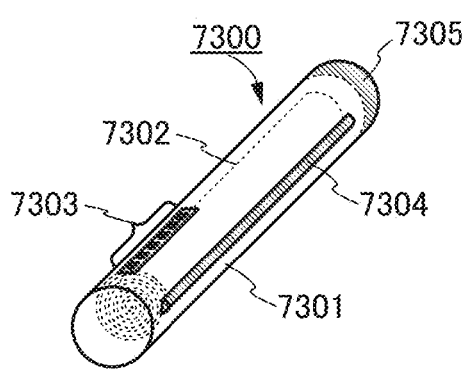

FIG. 17C illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, ON/OFF of the power, switching of displayed videos, and the like can be performed.

Figure 17D:
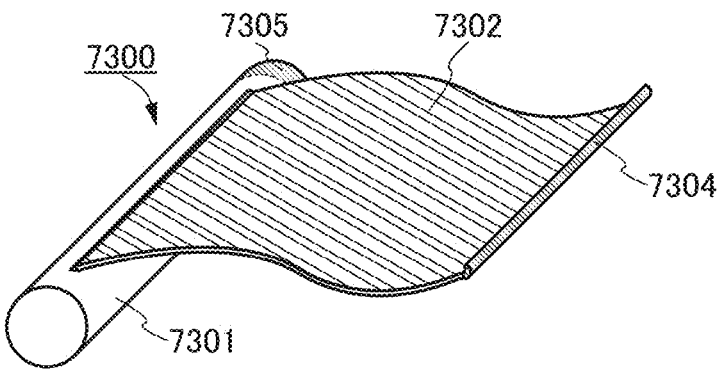

FIG. 17D illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 17C, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

Figure 18A:
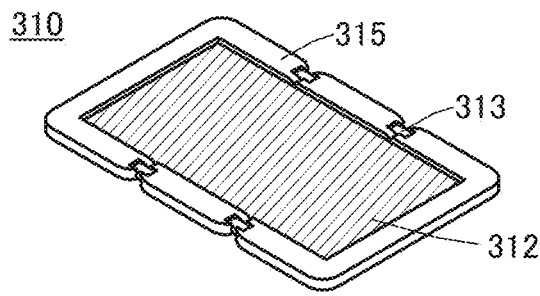
FIGS. 18A to 18I are structure examples of electronic devices.
Figure 18B:
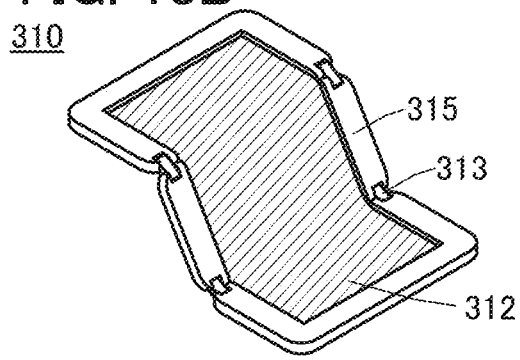
Figure 18C:
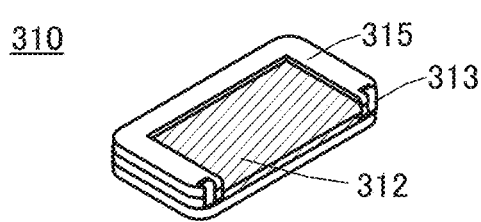
Figure 18D:
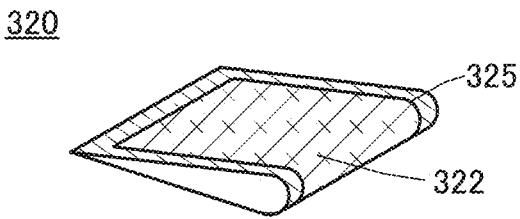
Figure 18E:
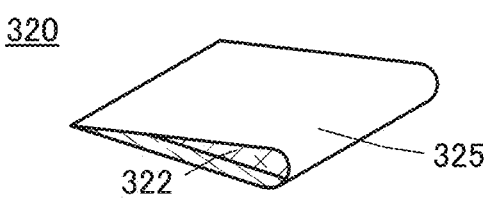
Figure 18F:
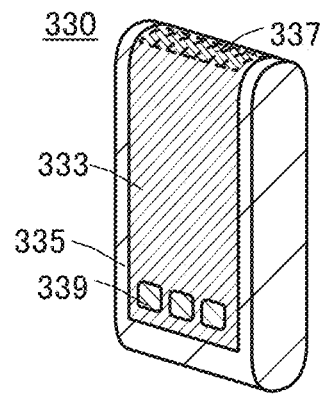

FIGS. 18A to 18F illustrate a foldable portable information terminal 310. FIG. 18D illustrates the portable information terminal 310 that is opened. FIG. 18E illustrates the portable information terminal 310 that is being opened or being folded. FIG. 18F illustrates the portable information terminal 310 that is folded. The portable information terminal 310 is highly portable when folded. When the portable information terminal 310 is opened, a seamless large display region is highly browsable.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device fabricated by any of the peeling methods of embodiments of the present invention can be used for the display panel 312. For example, a display device that can be bent with a radius of curvature of greater than or equal to 1 mm and less than or equal to 150 mm can be used.

FIGS. 18D and 18E illustrate a foldable portable information terminal 320. FIG. 18D is the portable information terminal 320 that is folded so that the display portion 322 exists on the outside. FIG. 18E is the portable information terminal 320 that is folded so that the display portion 322 exists on the inside. Because a non-display portion 325 exists on the outside when the portable information terminal 320 is not used, the display portion 322 can be prevented from dirt and scratches. The display device according to one embodiment of the present invention can be used for the display portion 322.

Figure 18G:
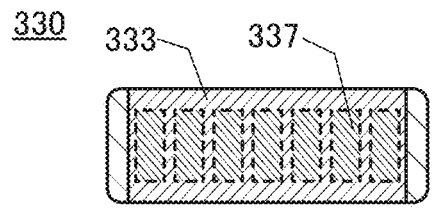
Figure 18H:
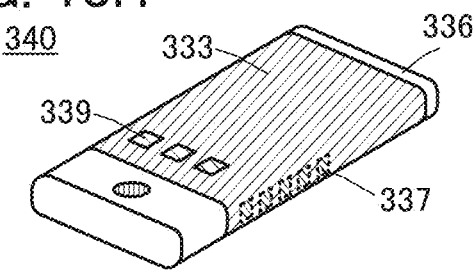

FIG. 18F is a perspective view illustrating an external shape of the portable information terminal 330. FIG. 18G is a top view of the portable information terminal 330. FIG. 18H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 18F and 18H). In addition, information 337 indicated by dashed rectangles can be displayed on another surface (FIGS. 18G and 18H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 18F and 18G illustrate an example in which the information 337 is displayed at the top, one embodiment of the present invention is not limited thereto. The information may be displayed, for example, on the side as illustrated in FIG. 18H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A display device fabricated by any of the embodiments of the present invention can be used for a display portion 333 mounted in each of a housing 335 of the portable information terminal 330 and a housing 336 of the portable information terminal 340. One embodiment of the present invention makes it possible to provide a highly reliable display device having a curved display portion with a high yield.

Figure 18I:
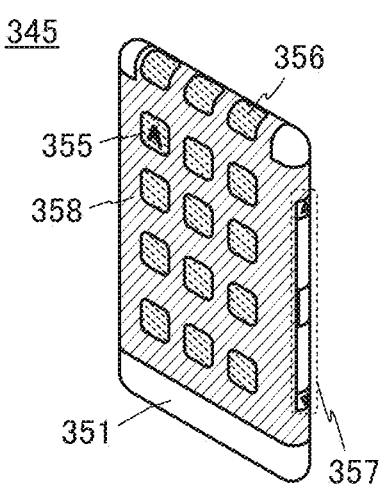

Information may be displayed, for example, on three or more sides in a portable information terminal 345 illustrated in FIG. 18I. Here, information 355, information 356, and information 357 are displayed on different sides.

A display device fabricated by one embodiment of the present invention can be used for a display portion 358 mounted in a housing 351 of the portable information terminal 345. According to one embodiment of the present invention, a highly reliable portable display device having a curved display portion can be provided at a high yield.

The touch panel of one embodiment of the present invention can be used for a display portion of an electronic device described above. Thus, reduction in thickness and weight and multi-functionalization of any of the electronic devices can be achieved and thus the electronic device can have high sensitivity.

At least part of this embodiment can be implemented in combination with any of the embodiments described in this specification as appropriate.

Embodiment 6

An oxide semiconductor that can be favorably used for a semiconductor layer of a semiconductor device which can be used for the display panel of one embodiment of the present invention is described in this embodiment.

An oxide semiconductor forming the oxide film has a wide energy gap of 3.0 eV or more. A transistor including an oxide semiconductor film obtained by processing of the oxide semiconductor in an appropriate condition and a sufficient reduction in carrier density of the oxide semiconductor can have much lower off-state current than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (e.g., cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an in-Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga. and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)$, (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

Note that if the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" refers to the state where an oxide semiconductor layer has a carrier density which is lower than $1\times10^{17}/cm^3$, preferably lower than $1\times10^{15}/cm^3$, more preferably lower than $1\times10^{13}/cm^3$, further preferably lower than $8\times10^{11}/cm^3$, still further preferably lower than $1\times10^{11}/cm^3$, yet further preferably lower than $1\times10^{10}/cm^3$, and is $1\times10^{-9}/cm^3$ or higher.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, further preferably less than or equal to $1\times10^{-24}$ A; or at 85° C., less than or equal to $1\times10^{-21}$ A, preferably less than or equal to $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

A structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 19A:
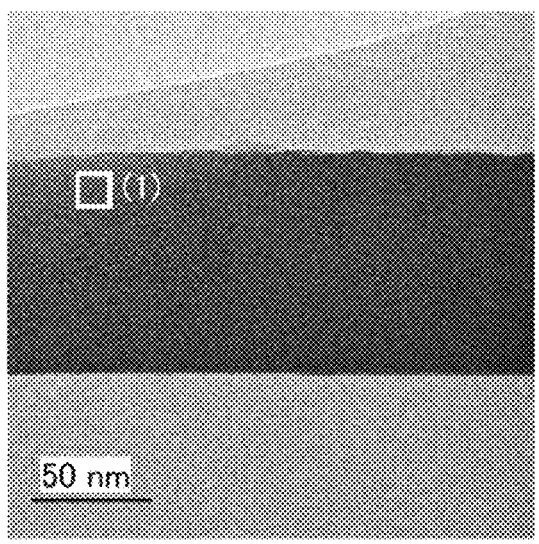
FIGS. 19A to 19D are Cs-corrected high-resolution TEM images of a cross section of a CAAC-OS and a cross-sectional schematic view of a CAAC-OS.

A CAAC-OS observed with TEM is described below. FIG. 19A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 19B:
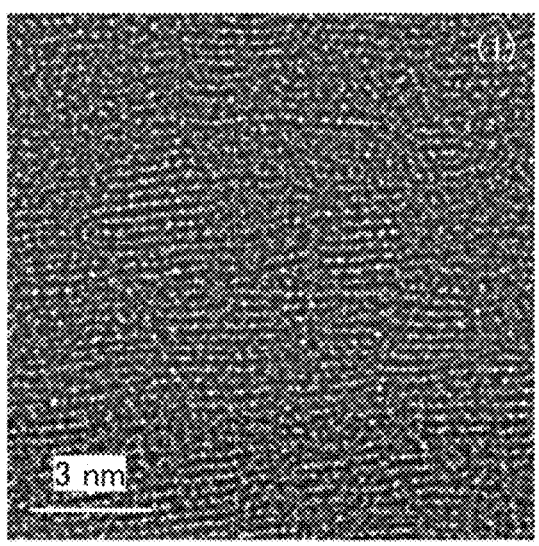

FIG. 19B is an enlarged Cs-corrected high-resolution TEM image of a region (1) in FIG. 19A. FIG. 19B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 19C:
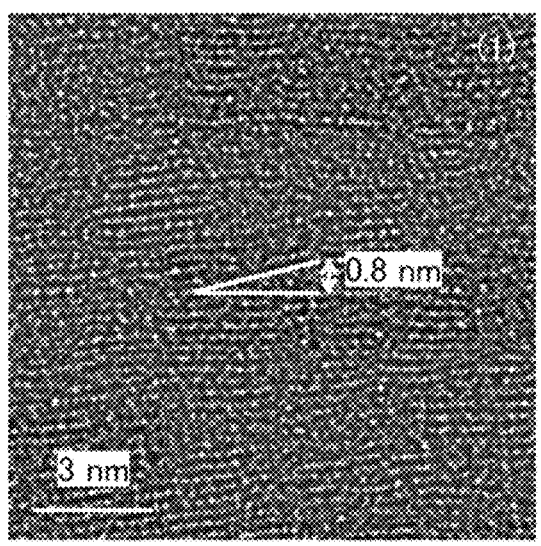

As shown in FIG. 19B, the CAAC-OS has a characteristic atomic arrangement. The characteristic atomic arrangement is denoted by an auxiliary line in FIG. 19C. FIGS. 12B and 12C prove that the size of a pellet is approximately 1 nm to 3 nm, and the size of a space caused by tilt of the pellets is approximately 0.8 nm. Therefore, the pellet can also be referred to as a nanocrystal (nc).

Here, according to the Cs-corrected high-resolution TEM images, the schematic arrangement of pellets 5100 of a CAAC-OS over a substrate 5120 is illustrated by such a structure in which bricks or blocks are stacked (see FIG.

Figure 19D:
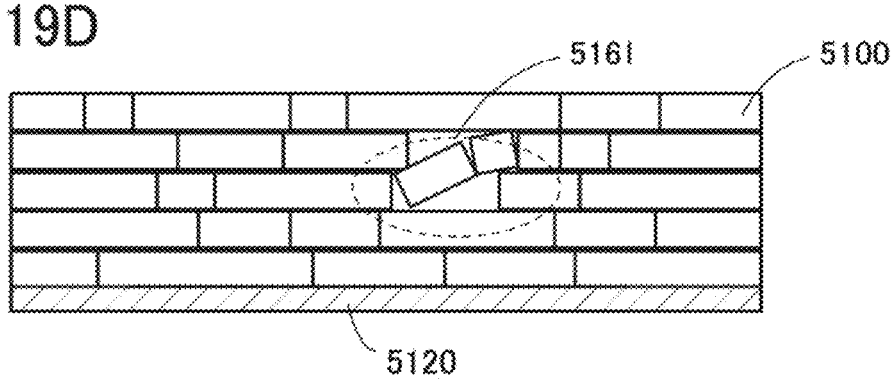

19D). The part in which the pellets are tilted as observed in FIG. 19C corresponds to a region 5161 shown in FIG. 19D.

Figure 20A:
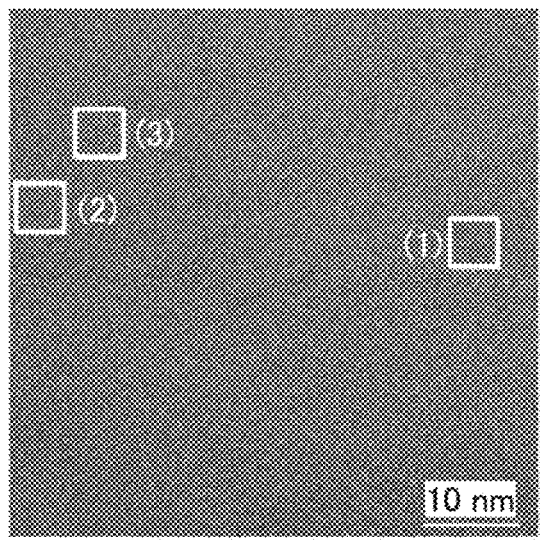
FIGS. 20A to 20D are Cs-corrected high-resolution TEM images of a plane of a CAAC-OS.
Figure 20B:
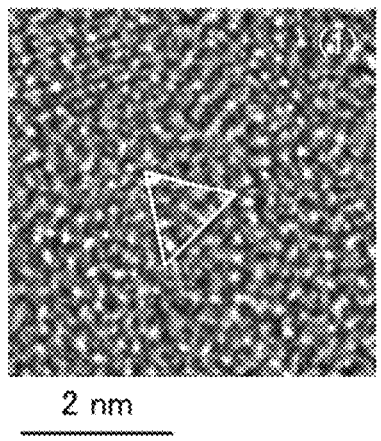
Figure 20C:
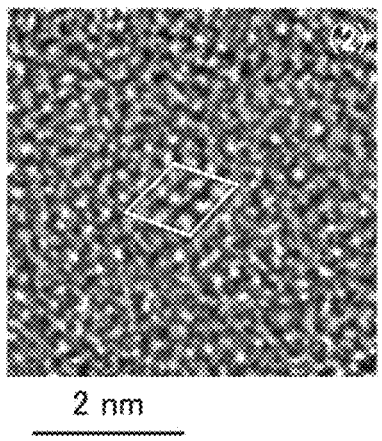
Figure 20D:
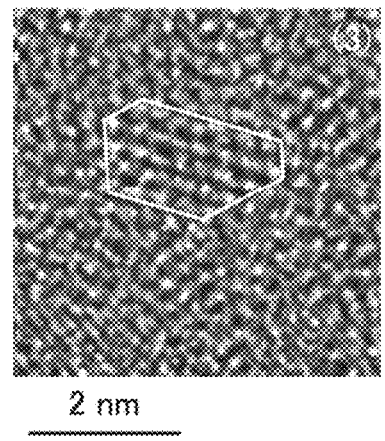

FIG. 20A shows a Cs-corrected high-resolution TEM image of a plane of the CAAC-OS observed from a direction substantially perpendicular to the sample surface. FIGS. 20B, 20C, and 20D are enlarged Cs-corrected high-resolution TEM images of regions (1), (2), and (3) in FIG. 20A, respectively. FIGS. 20B, 20C, and 20D indicate that metal atoms are arranged in a triangular, quadrangular, or hexagonal configuration in a pellet. However, there is no regularity of arrangement of metal atoms between different pellets.

Figure 21A:
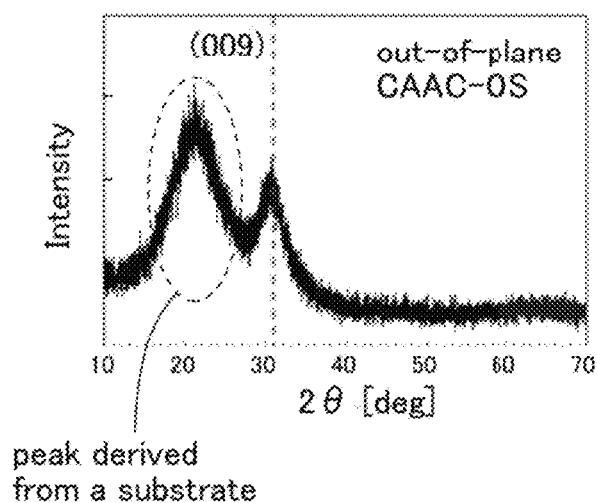
FIGS. 21A to 21C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 21A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 21B:
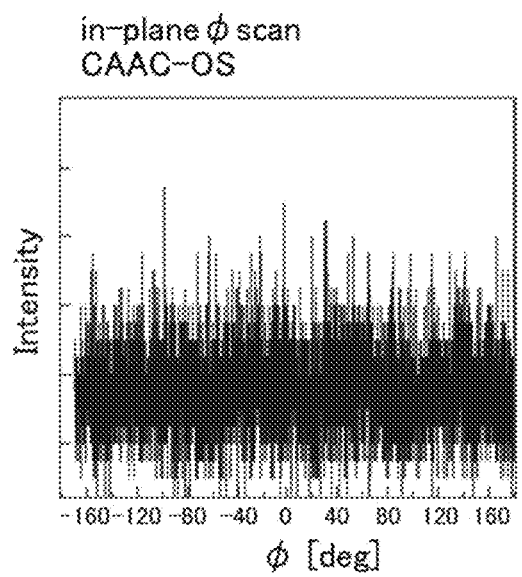
Figure 21C:
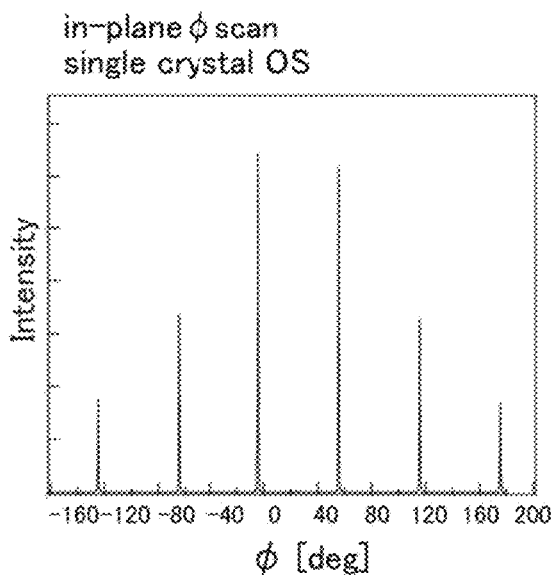

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 21B, a peak is not clearly observed. In contrast, in the case of a single crystal oxide semiconductor of InGaZnO$_4$, when φ scan is performed with 2θ fixed at around 56°, as shown in FIG. 21C, six peaks which are derived from crystal planes equivalent to the (110) plane are observed. Accordingly, the structural analysis using XRD shows that the directions of a-axes and b-axes are different in the CAAC-OS.

Figure 22A:
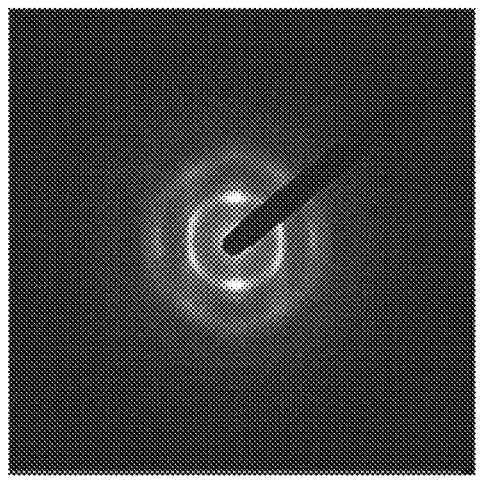
FIGS. 22A and 22B show electron diffraction patterns of a CAAC-OS.
Figure 22B:
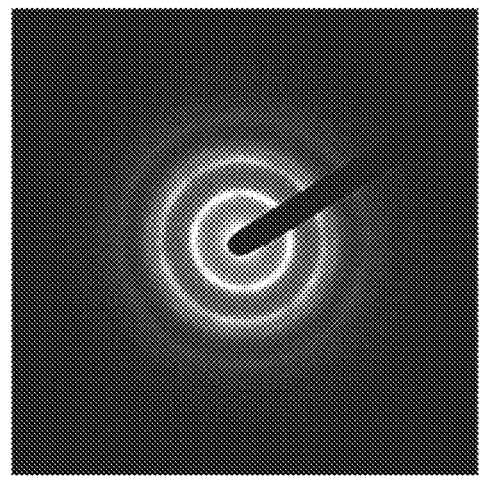

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 22A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 22B shows a diffraction pattern obtained in such a manner that an electron beam with a probe diameter of 300 nm is incident on the same sample in a direction perpendicular to the sample surface. As shown in FIG. 22B, a ring-like diffraction pattern is observed. Thus, the electron diffraction also indicates that the a-axes and b-axes of the pellets included in the CAAC-OS do not have regular alignment. The first ring in FIG. 22B is considered to be derived from the (010) plane, the (100) plane, and the like of the InGaZnO$_4$ crystal. The second ring in FIG. 22B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as sample A), an nc-OS (referred to as sample B), and a CAAC-OS (referred to as sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 23:
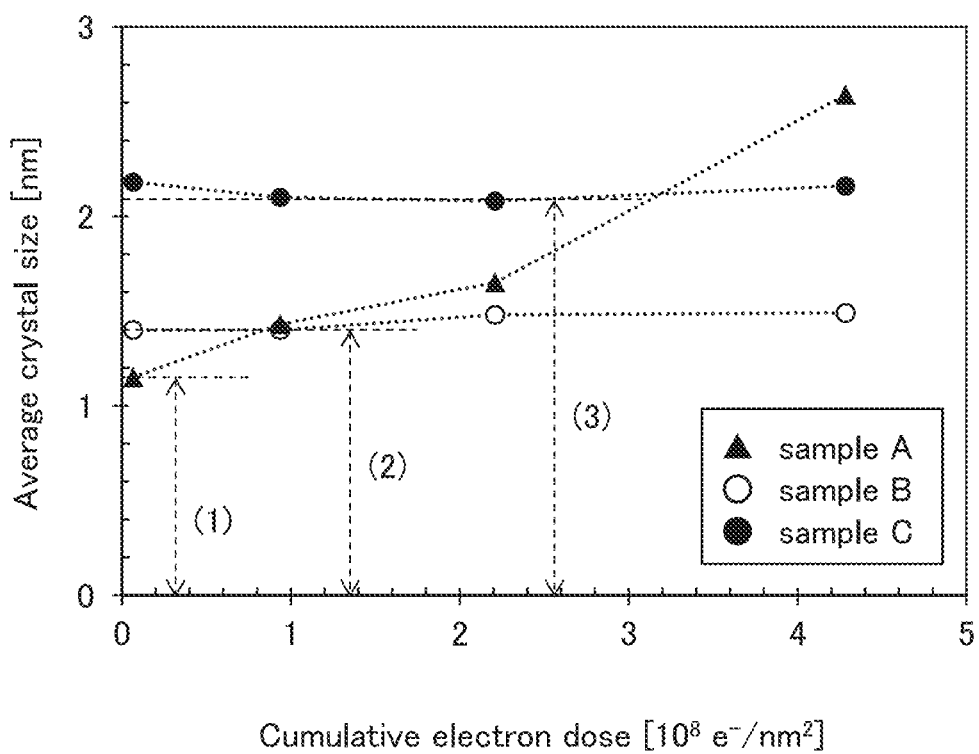
FIG. 23 shows a change of crystal parts of an In—Ga—Zn oxide owing to electron irradiation.

FIG. 23 shows change in the average size of crystal parts (at 22 points to 45 points) in each sample. Note that the crystal part size corresponds to the length of a lattice fringe. FIG. 23 indicates that the crystal part size in the a-like OS increases with an increase in the cumulative electron dose. Specifically, as shown by (1) in FIG. 23, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 23, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

The CAAC-OS film is formed, for example, by the following method.

For example, the CAAC-OS film is formed by a sputtering method with a polycrystalline oxide semiconductor sputtering target.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C. preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film with a thickness greater than or equal to 1 nm and less than 10 nm can be easily crystallized by heat treatment as compared to the case where the first oxide semiconductor film has a thickness greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

In the above-described manner, a CAAC-OS film with a total thickness of greater than or equal to 10 nm can be formed.

At least part of this embodiment can be implemented in combination with any of the other embodiments described in this specification as appropriate.

This application is based on Japanese Patent Application serial no. 2013-245397 filed with Japan Patent Office on Nov. 27, 2013 and Japanese Patent Application serial no. 2013-245400 filed with Japan Patent Office on Nov. 27, 2013, the entire contents of which are hereby incorporated by reference.

What is claimed is:

1. A touch panel comprising:
a display portion over a resin layer;
a first adhesive layer over the display portion;
a touch sensor over the first adhesive layer;
a second adhesive layer over the touch sensor;
a first FPC electrically connected to the display portion;
an IC mounted on the first FPC, the IC functioning as a signal line driver circuit;
a second FPC electrically connected to the touch sensor;
a third FPC electrically connected to the touch sensor;
a conductive layer over the resin layer, the conductive layer comprising a depression portion; and
a conductive particle over and in contact with the conductive layer,
wherein the display portion comprises:
a first insulating layer over the resin layer;
a transistor over the first insulating layer;
a second insulating layer over the transistor; and
a light-emitting element over the second insulating layer,
wherein the touch sensor comprises:
a first sensor electrode over the first adhesive layer;
a third insulating layer over the first sensor electrode; and
a second sensor electrode over the third insulating layer, and
wherein the conductive particle is positioned inside the depression portion of the conductive layer.

2. The touch panel according to claim 1, wherein the transistor comprises a semiconductor layer including an oxide semiconductor.

3. The touch panel according to claim 1, wherein the transistor comprises a semiconductor layer including polycrystalline silicon.

4. The touch panel according to claim 1, wherein, when seen from above, the first FPC faces the second FPC with the display portion and the touch sensor therebetween.

5. The touch panel according to claim 1, wherein the resin layer is a third adhesive layer.

6. A touch panel comprising:
a display portion over a resin layer;
a first adhesive layer over the display portion;
a touch sensor over the first adhesive layer;
a second adhesive layer over the touch sensor;
a first FPC electrically connected to the display portion;
an IC mounted on the first FPC, the IC functioning as a signal line driver circuit;
a second FPC electrically connected to the touch sensor;
a conductive layer over the resin layer, the conductive layer comprising a depression portion; and
a conductive particle over and in contact with the conductive layer,
wherein the display portion comprises:
a first insulating layer over the resin layer;
a transistor over the first insulating layer;
a second insulating layer over the transistor; and
a light-emitting element over the second insulating layer,
wherein the touch sensor comprises:
a first sensor electrode over the first adhesive layer;
a third insulating layer over the first sensor electrode; and
a second sensor electrode over the third insulating layer, and
wherein the conductive particle is positioned inside the depression portion of the conductive layer.

7. The touch panel according to claim 6, wherein the transistor comprises a semiconductor layer including an oxide semiconductor.

8. The touch panel according to claim 6, wherein the transistor comprises a semiconductor layer including polycrystalline silicon.

9. The touch panel according to claim 6, wherein, when seen from above, the first FPC faces the second FPC with the display portion and the touch sensor therebetween.

10. The touch panel according to claim 6, wherein the resin layer is a third adhesive layer.

* * * * *